US008716116B2

(12) United States Patent
Parekh et al.

(10) Patent No.: US 8,716,116 B2
(45) Date of Patent: May 6, 2014

(54) METHOD OF FORMING A DRAM ARRAY OF DEVICES WITH VERTICALLY INTEGRATED RECESSED ACCESS DEVICE AND DIGITLINE

(75) Inventors: Kunal Parekh, Boise, ID (US); Ceredig Roberts, Boise, ID (US); Thy Tran, Boise, ID (US); Jim Jozwiak, Boise, ID (US); David Hwang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 874 days.

(21) Appl. No.: 12/721,373

(22) Filed: Mar. 10, 2010

(65) Prior Publication Data

US 2011/0220994 A1    Sep. 15, 2011

(51) Int. Cl.
*H01L 29/94*    (2006.01)

(52) U.S. Cl.
USPC ...... 438/586; 257/302; 257/330; 257/E21.19; 257/E29.262

(58) Field of Classification Search
USPC ............ 257/302, 330, 334, E21.19, E29.262; 438/586
See application file for complete search history.

(56) References Cited

U.S. PATENT DOCUMENTS

| | | | |
|---|---|---|---|
| 6,316,309 B1 | 11/2001 | Holmes et al. | |
| 6,348,374 B1 | 2/2002 | Athavale et al. | |
| 6,492,233 B2 | 12/2002 | Forbes et al. | |
| 6,537,870 B1 | 3/2003 | Shen | |
| 6,689,660 B1 | 2/2004 | Noble et al. | |
| 6,930,324 B2 | 8/2005 | Kowalski et al. | |
| 7,084,043 B2 | 8/2006 | Birner et al. | |
| 7,359,226 B2 | 4/2008 | Schwerin | |
| 2006/0145136 A1 | 7/2006 | Verhoeven | |
| 2006/0258084 A1* | 11/2006 | Tang et al. | 438/239 |
| 2008/0005118 A1 | 1/2008 | Shakib et al. | |
| 2010/0001249 A1* | 1/2010 | Uchiyama | 257/2 |

OTHER PUBLICATIONS

'Buried Wordline' DRAM becomes reality, Electronic News, http://www.electrnoicsnews.com, Nov. 24, 2008.
Maeda, S. et al., Impact of a Vertical o-Shape Transistor Cell for 1gbit Dram and Beyond, IEEE, Dec. 1995, pp. 2117-2123, vol. 42; Issue 12.

* cited by examiner

*Primary Examiner* — Colleen Matthews
*Assistant Examiner* — Colleen E Snow
(74) *Attorney, Agent, or Firm* — Fletcher Yoder, P.C.

(57) ABSTRACT

A method is disclosed for forming a memory device having buried access lines (e.g., wordlines) and buried data/sense lines (e.g., digitlines) disposed below vertical cell contacts. The buried wordlines may be formed trenches in a substrate extending in a first direction, and the buried digitlines may be formed from trenches in a substrate extending in a second direction perpendicular to the first direction. The buried digitlines may be coupled to a silicon sidewall by a digitline contact disposed between the digitlines and the silicon substrate.

23 Claims, 24 Drawing Sheets

US 8,716,116 B2

METHOD OF FORMING A DRAM ARRAY OF DEVICES WITH VERTICALLY INTEGRATED RECESSED ACCESS DEVICE AND DIGITLINE

BACKGROUND

1. Field of Invention

Embodiments of the invention relate generally to semiconductor devices and, more particularly, to methods of fabrication of such semiconductor devices having buried digitlines and wordlines.

2. Description of Related Art

Many types of electronic devices include data cells with a single transistor. Typically, the transistor controls whether a stimulus (e.g., a current or voltage) is applied to, or by, a data element (e.g., a memory element, an imaging element, or other device configured to output data, such as various kinds of sensors). Often a large number of data elements are disposed in an array, and the transistor allows individual data elements in the array to be selected. For example, certain types of dynamic random access memory (DRAM) cells include both a capacitor, which functions as a data element, and a single transistor, which functions as an access device, connected to the capacitor. The capacitor usually stores data by storing a charge that is representative of data (e.g., a 0 or a 1 in a single-bit device, or a 00, 01, 10, or 11 in a two-bit device), and the transistor typically controls access to the capacitor by controlling the flow of current to and from the capacitor, allowing current to flow during reading and writing and preventing current from flowing when retaining data.

Often the data elements are arranged in an array, e.g., generally in rows and columns. Data cells within the array are accessed, e.g., written to or read from, through circuitry near the periphery of the array. For instance, sense amplifiers or other sensing circuitry are often positioned adjacent arrays of data cells for reading data. Similarly, address decoders, e.g., row and column address decoders, are often disposed adjacent the array for addressing particular data cells or groups of data cells.

As the footprints of such devices become smaller, the components of the device may become smaller and/or denser for a given storage capacity. Additionally, some structures may be more vertical (i.e., less planar with respect to the substrate) to reduce footprint size. In such devices, construction of the data elements and the support structures (e.g., digitlines, wordlines, etc.) may present challenges and may limit scaling such devices to smaller footprints and higher densities.

DETAILED DESCRIPTION

An embodiment of a process for fabricating a vertical cell configuration structure 10 (e.g., a DRAM device) having buried access lines, for example wordlines, and buried data/sense lines, for example digitlines, is described below with reference to FIGS. 1-24. The process may provide increased area for the construction of storage node contacts in $4F^2$ architectures and may maximize the area available for construction of such contacts (or other vertical structures) by constructing the digitlines below the contact area. Additionally, each subsurface (also referred to as "buried") digitline may be electrically coupled to the silicon substrate via a single-sided digitline contact (also referred to as a single-sided strap). It should be appreciate that the techniques described below may also be implemented in embodiments having greater than $4F^2$.

Figure 1:
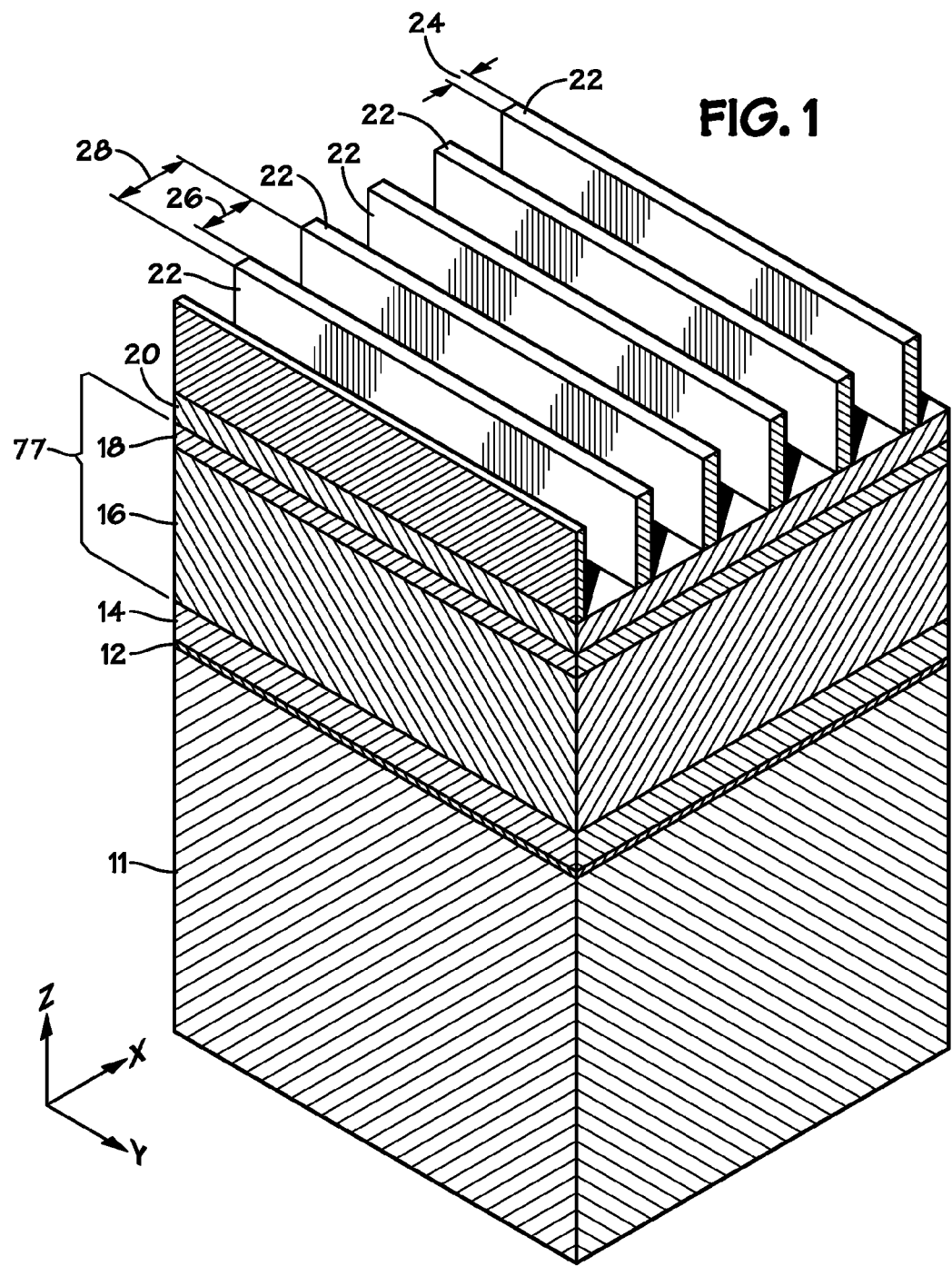
FIGS. 1-24 illustrate an embodiment of a process for forming a memory device having buried wordlines and buried digitlines in accordance with embodiments of the present invention.
Figure 2:
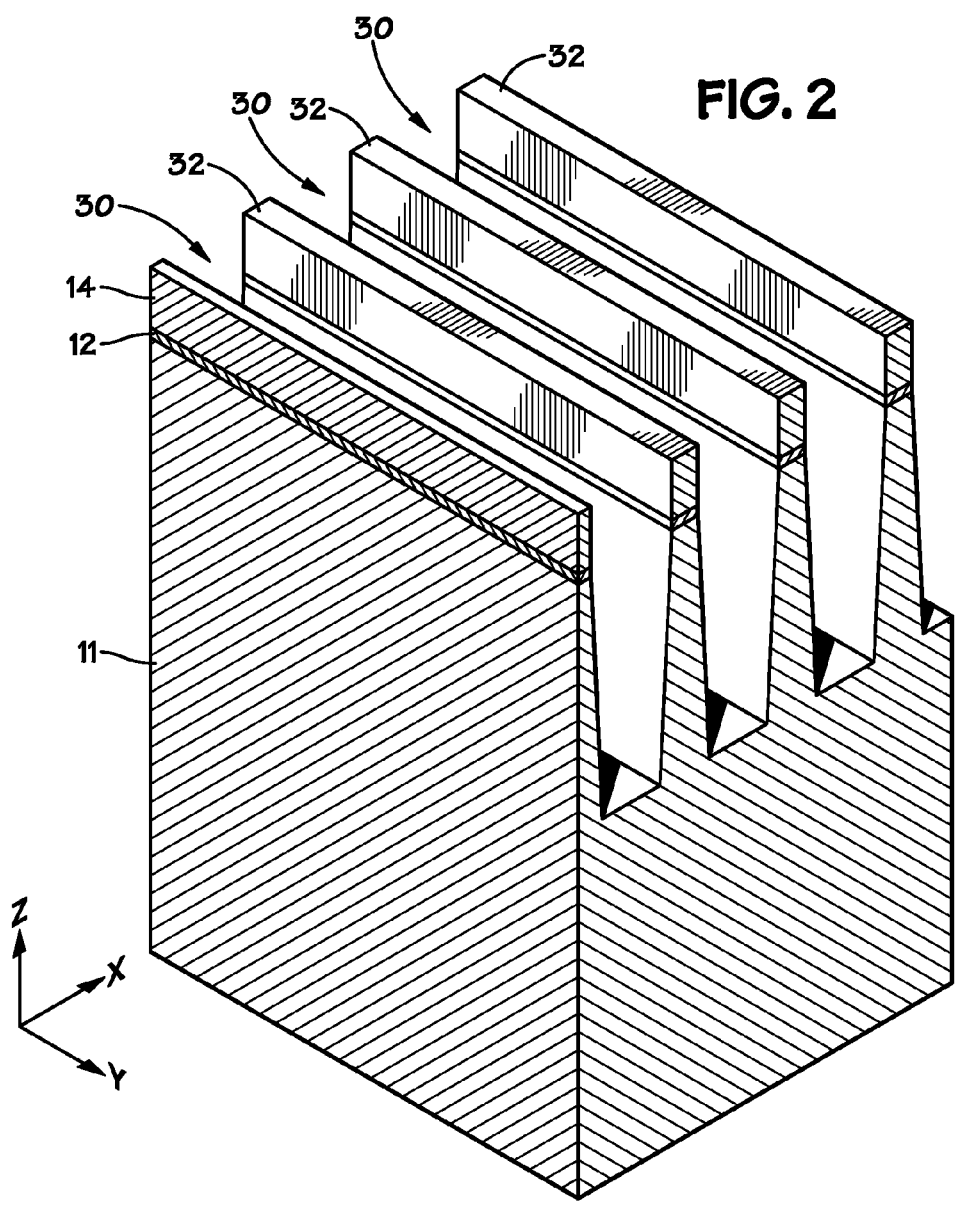
Figure 3:
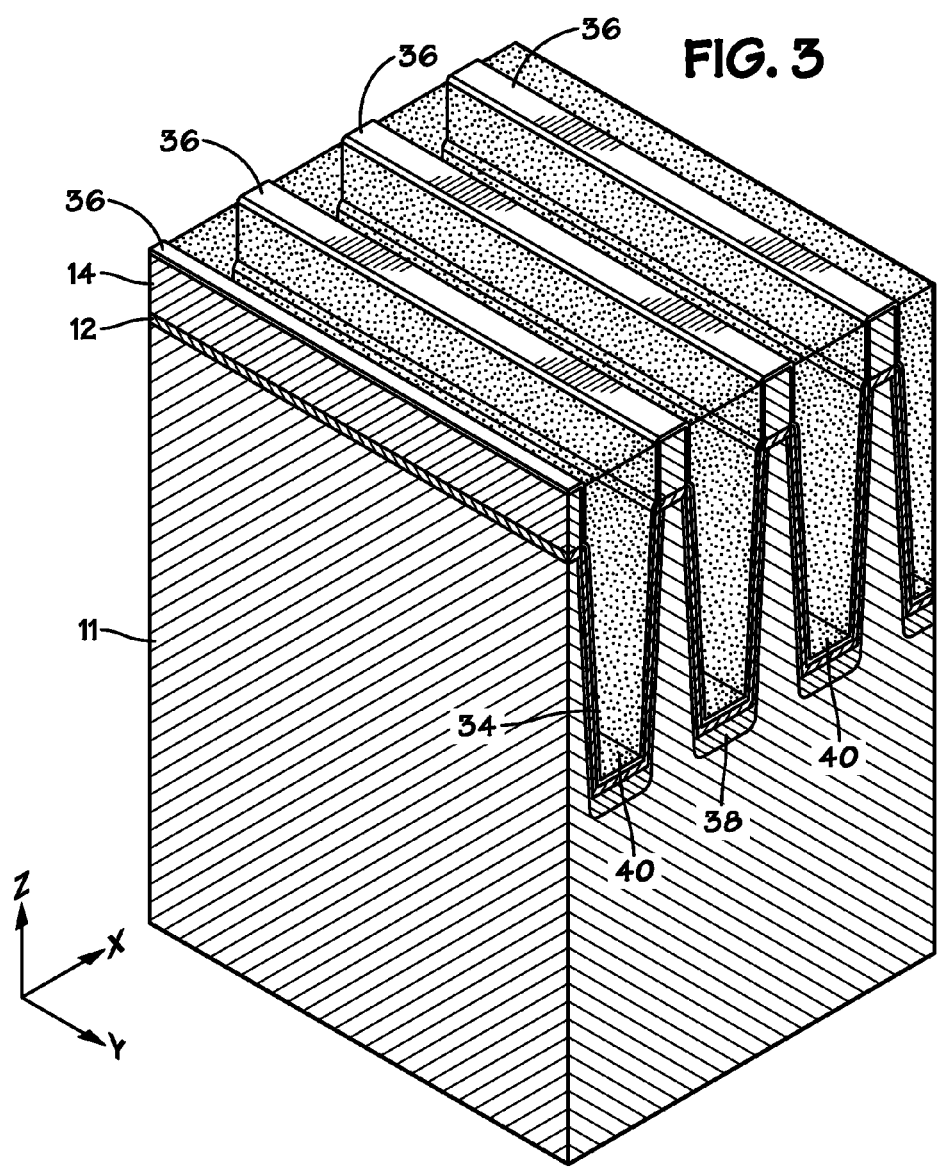

FIG. 1 illustrates a first step in an embodiment of a process for forming a vertical cell DRAM device. FIGS. 1-3 depict a shallow trench isolation process for formation of buried wordline trenches. The process may begin with providing a silicon substrate 11 that will be used to form the buried wordlines and buried digitlines below vertical cells formed on the substrate 11. An oxide 12 may be formed on the substrate 11, and a nitride 14 formed on the oxide 12, defining the active carrier region of the silicon substrate 11.

Trenches may be patterned on the substrate 11 via photolithography or other lithographic processes. In some embodiments, a top coat (TC) 16 and an anti-reflective coating (ARC) 17 formed on the nitride during photolithography processing. The ARC 17 may include a dielectric anti-reflective coating (DARC) 18 and a bottom anti-reflective coating (BARC) 20 deposited on the TC 16. Next, a mask 22 may be formed on the ARC deposition 17 to define masked regions having a width 24 and exposed regions having a width 26. The mask 22 may be formed with photoresist, a hard masking material, a carbon-based hard mask, and may be patterned with any photolithography or other lithographic processes, including spacer based patterning techniques. The widths 24 and/or 26 may be generally equal to or less a F, ¾ F, or ½ F. The mask 22 may define a repeating pattern of lines with a pitch 28. The masked regions of the mask 22 may be generally straight, generally parallel to one another, and may generally extend in the Y-direction.

Next, as shown in FIG. 2, wordline trenches 30 may be formed in the substrate 11. The trenches 30 may be formed with a dry etch or other suitable etch process that etches the nitride 14, the oxide 12, and the silicon substrate 11. The trenches may be defined by fins 32 which may be generally vertical and defining generally vertical and/or slightly sloped sidewalls of the trenches 30. As depicted in FIG. 2, the top portion of each fin 32 of a trench maintains the oxide 12 and nitride 14. The mask 22 and any excess material may be removed from the substrate 11 via a hydrofluoric acid clean or other process.

As shown in FIG. 3 the shallow trench isolation process may be completed by implanting the silicon substrate 11 below the trenches 30 and depositing an insulator in trenches 30. An oxide 34 may be formed on the sidewalls and bottom of the trenches 30, and a second nitride 36 may be formed on the oxide 34 and the nitride 14 via deposition or other suitable processes. A highly doped region 38 (e.g., p-type region) may be formed at or near the bottom of the trenches 30 by implantation.

After implantation, an insulator 40 (e.g., trench isolation) may fill the trenches 30 on the nitride 36. In one embodiment, the insulator 40 may be a spin-on dielectric (SOD). After formation of the insulator 40 in the trenches 30, the surface of the device 10 may be planarized via chemical-mechanical planarization (CMP) or other suitable planarization process.

Figure 4:
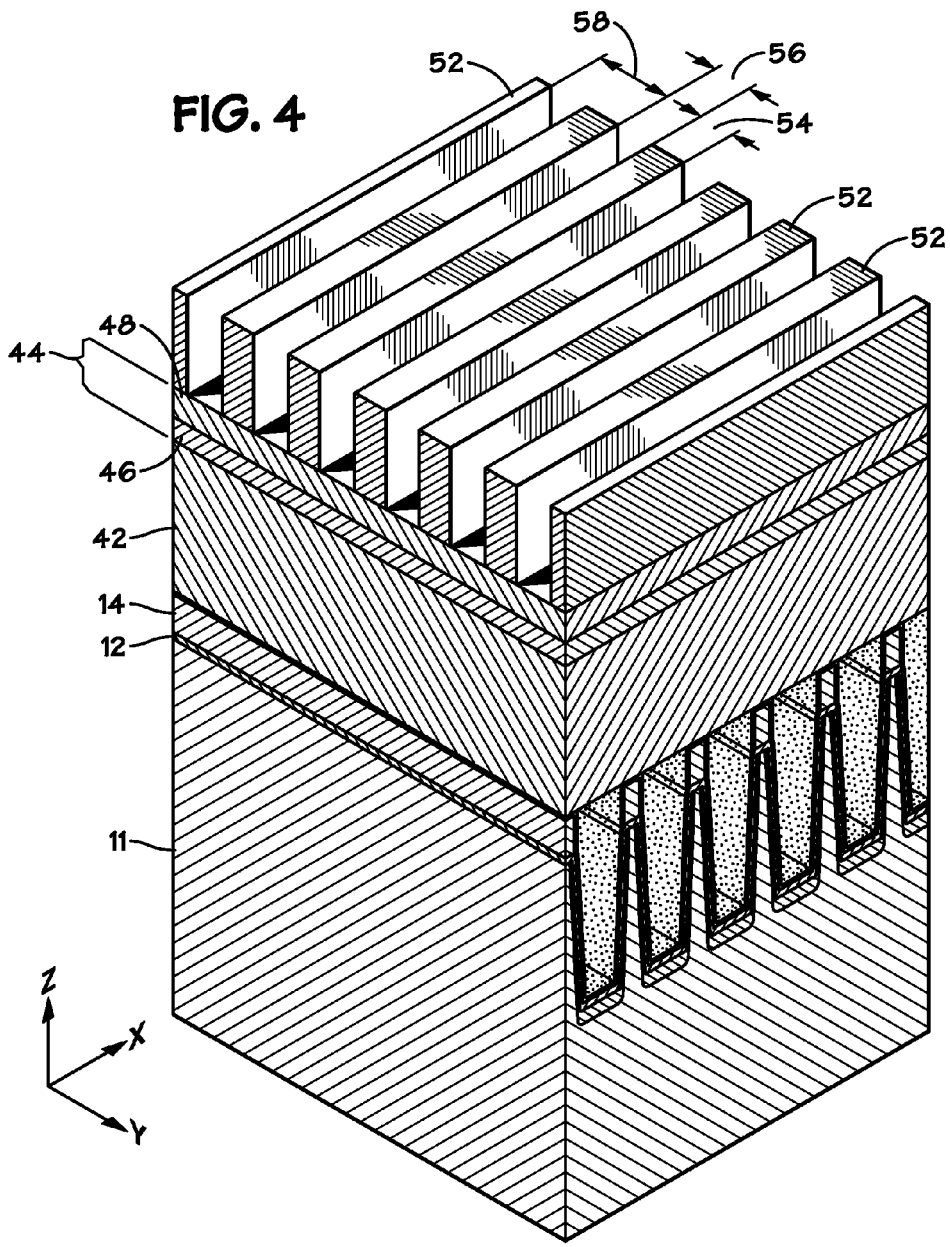

FIG. 4 begins the initial process steps for formation of a buried digitline. Trenches may be patterned on the surface of the device 10 via photolithography or other lithographic processes. In some embodiments, a top coat (TC) 42 and an anti-reflective coating (ARC) 44 are formed on the nitride during photolithography processing. The ARC 44 may include a dielectric anti-reflective coating (DARC) 46 and a bottom anti-reflective coating (BARC) 48 deposited on the TC 50. Next, a digitline trench mask 52 may be formed on the ARC deposition 44 to define masked regions having a width 54 and exposed regions having a width 56. The mask 52 may be formed with photoresist, a hard masking material, a carbon-based hard mask, and may be patterned with any photolithography or other lithographic processes, including spacer based patterning techniques. The widths 54 and/or 56 may be generally equal to or less a F, ¾ F, or ½ F. The mask 52 may define a repeating pattern of lines with a pitch 58. The masked regions of the mask 22 may be generally straight, generally parallel to one another, and may generally extend in the X-direction.

Figure 5:
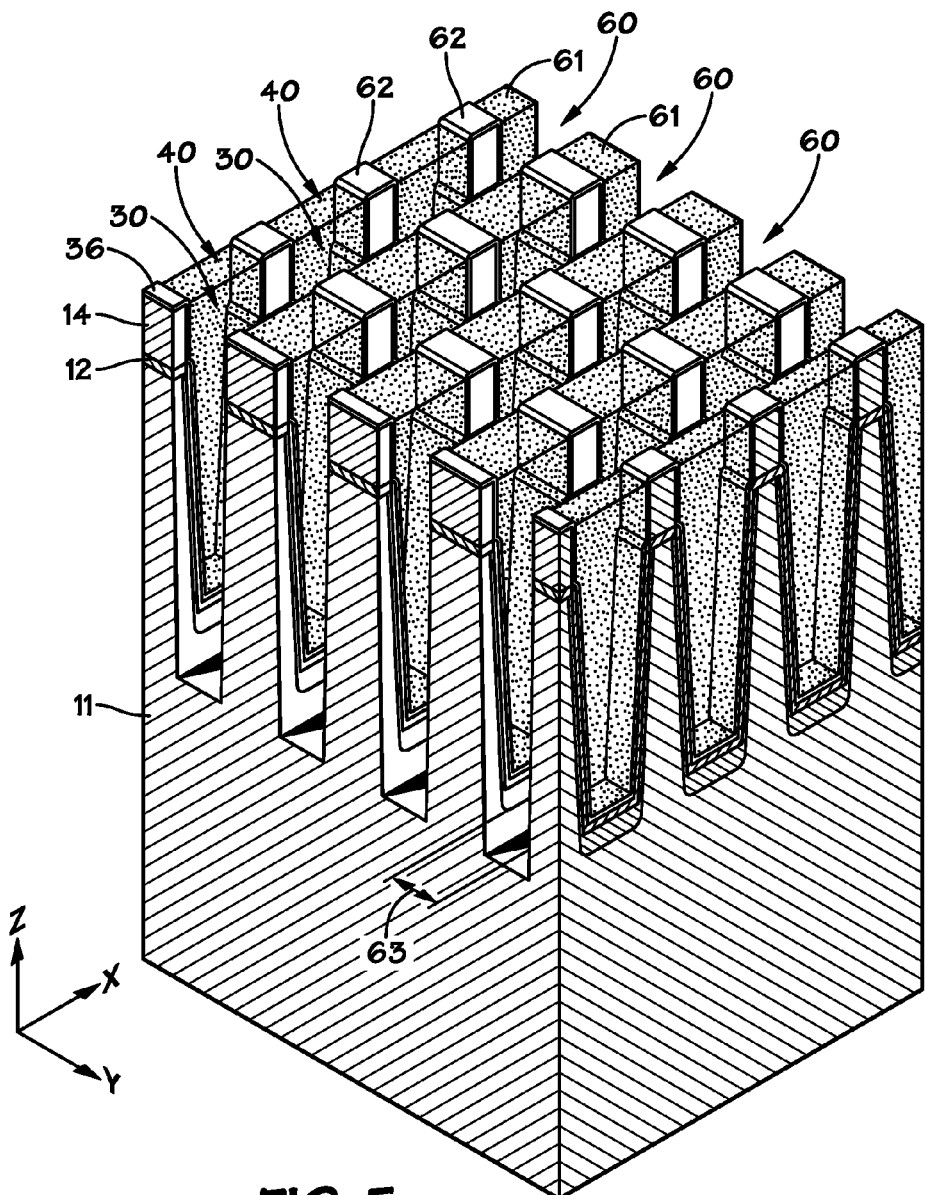

Next, as shown in FIG. 5, digitline trenches 60 may be formed in the substrate 11 in a plane below the trenches 30. The trenches 60 may be formed with a dry etch or other suitable etch process that etches the nitride 14, the oxide 12, the insulator 40, and the silicon substrate 11. The trenches 60 may result in formation of, and may be partially defined by pillars 62, which may be generally vertical and have generally vertical and/or sloped walls. As depicted in FIG. 5, the top portion of each pillar 62 includes the oxide 12 and nitride 14. The width of the pillars 62 in the X-direction is defined by the width of the trenches 30 and the width of the pillars 62 in the Y-direction is defined by the width of the trenches 60. In one embodiment, the pillars 62 may be generally rectangular such that they are symmetric in width, such that the width of the pillars 62 in the Y-direction is greater than the width of the pillars 62 in the X-direction. In other embodiments, the pillars 62 may be generally square; in such an embodiment, the spacing between each pillar (as defined by the formation of trenches 30 and 60) may be asymmetric to enable formation of the wordlines and digitlines discussed below. Additionally, as seen in FIG. 5, the pillars 62 and insulator 40 may form fins 61 that define the sidewalls of trenches 60.

As shown FIG. 5, the wordline trenches 30 extend generally in the Y-direction and the digitline trenches 60 extend generally in the X-direction perpendicular to, in plane below, and through a portion of the wordline trenches 30. The digitline line trenches 60 may be etched to a depth 63 below the bottom of the wordline trenches 30. The digitline trenches 60 are thus formed before formation of any transistors of the device 10 and are subsurface to (i.e., buried in) the silicon substrate 11. As discussed further below, to enable formation of the wordlines and digitlines the width 26 of the isolation trenches 30 may be greater than the width 56 of the digitline trenches 60.

Figure 6:
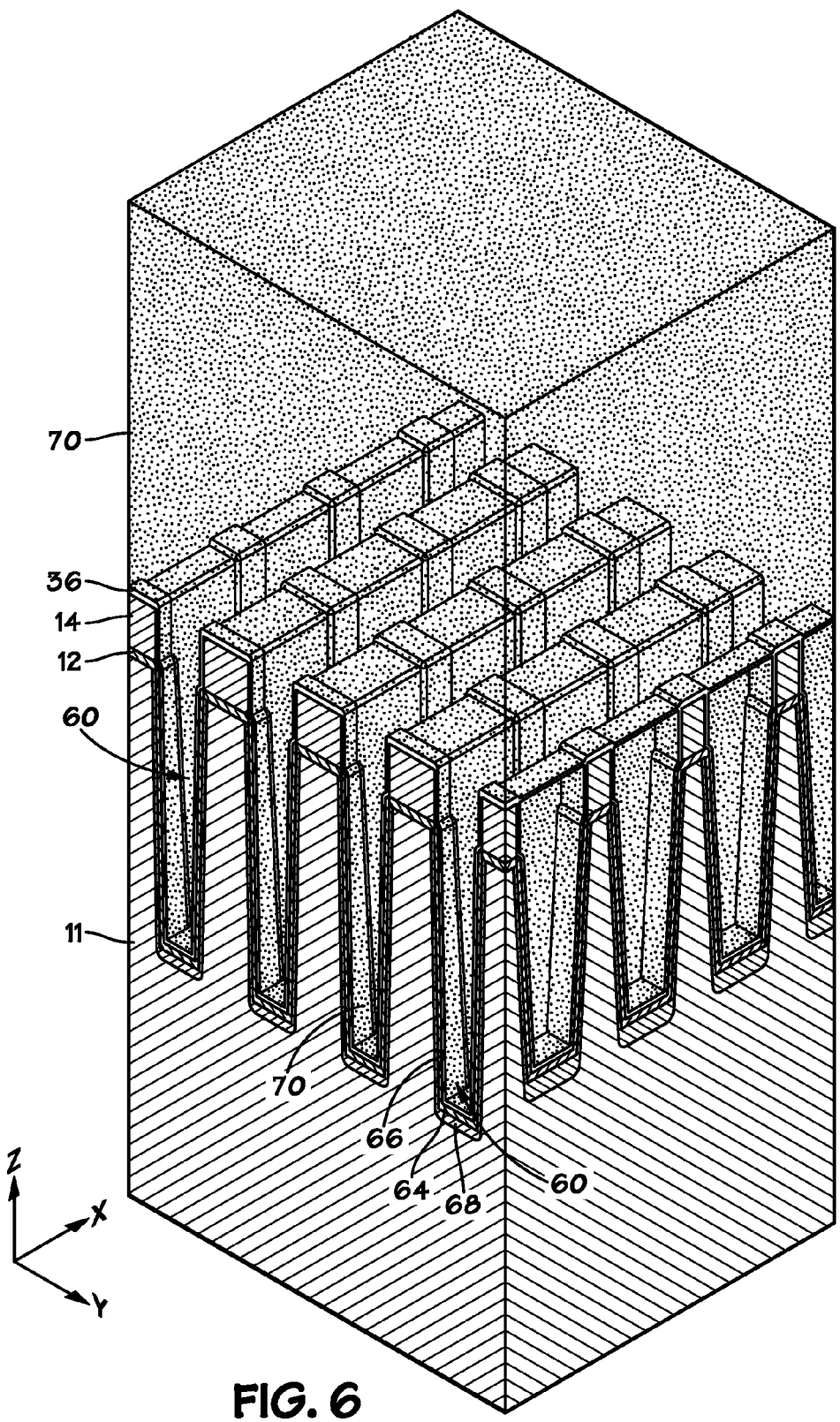

As shown in FIG. 6 a digitline oxide 64 may be formed on the sidewalls and bottom of the trenches 60 via oxidation or other suitable processes. A digitline nitride 66 may be formed on the oxide 64 via deposition or other suitable processes. The nitride 66 may be formed on the top portion of the pillars 62 and the sidewalls of the trenches 60 (e.g., on the insulator 40). A doped region 68 (e.g., p-type region) may be formed at or near the bottom of the trenches 60 by implantation.

Figure 7:
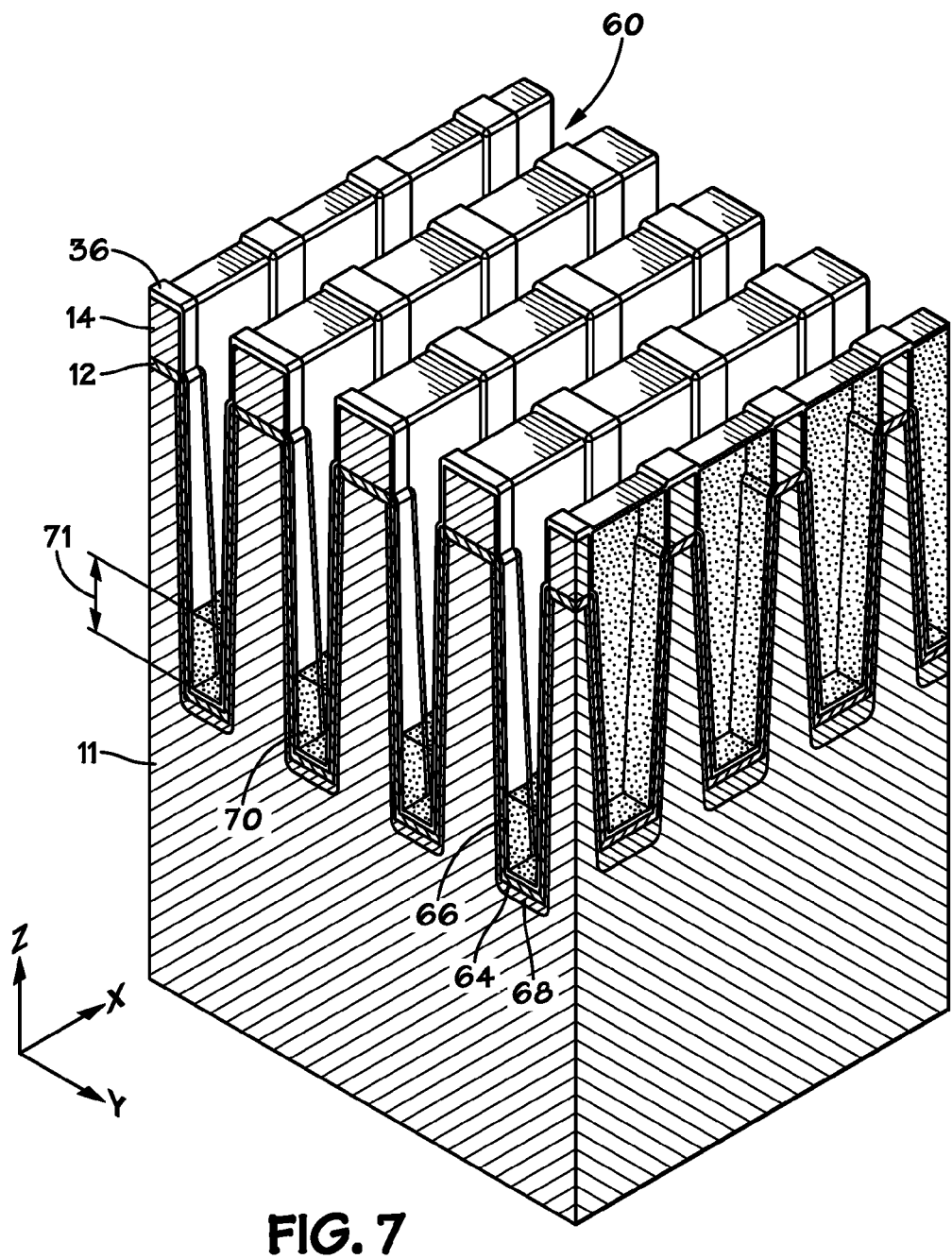

After implantation of regions 68, an insulator 70 (e.g., digitline isolation) may fill the trenches 60 on the nitride 66. In one embodiment, the insulator 70 may be a spin-on dielectric (SOD). Next as shown in FIG. 7, the insulator 70 may be etched back to expose the nitride 66 on the sidewalls of the trenches 60. A portion of the insulator 70 may be left in the bottom of the trenches 60 at a depth 71.

Figure 8:
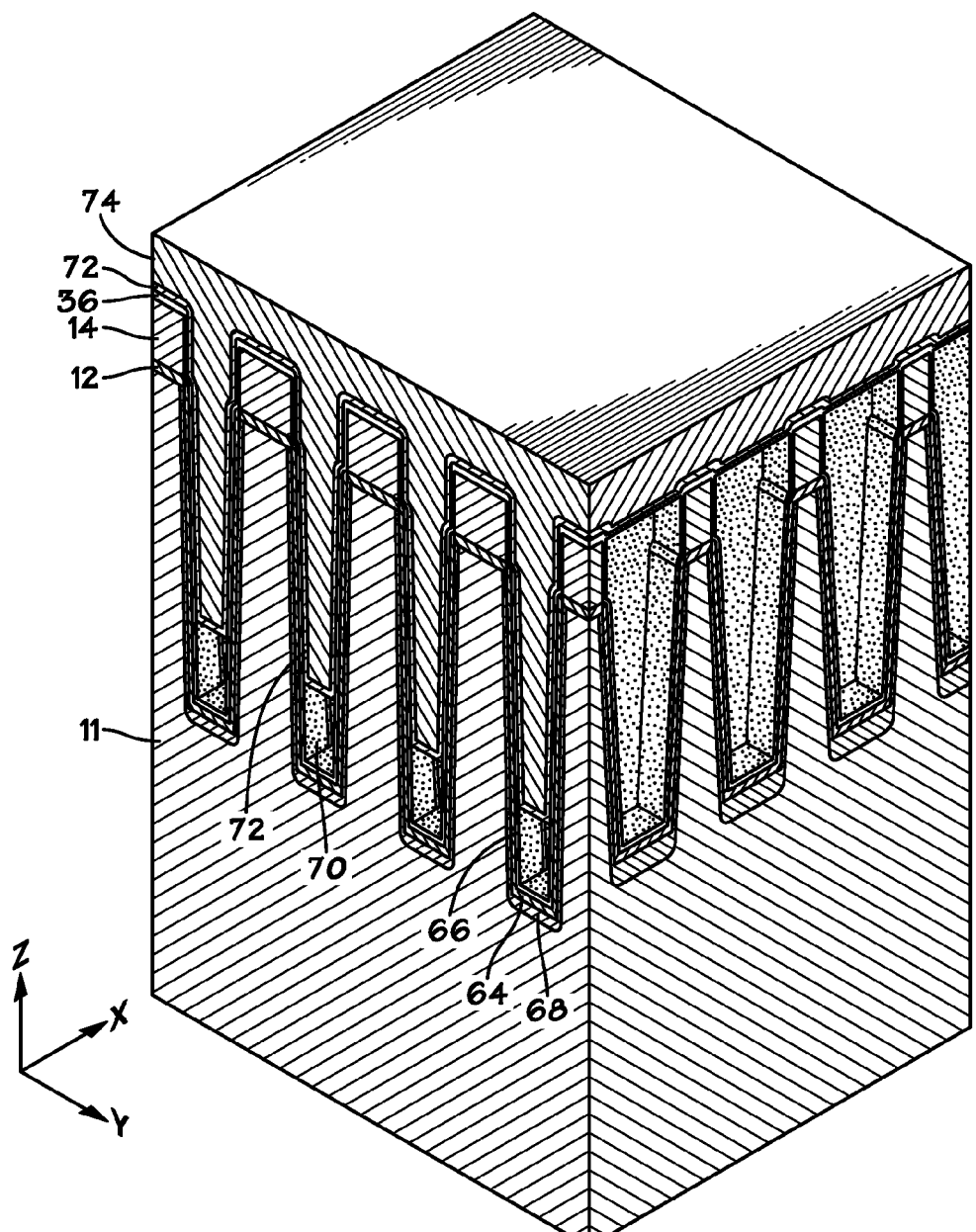
Figure 9:
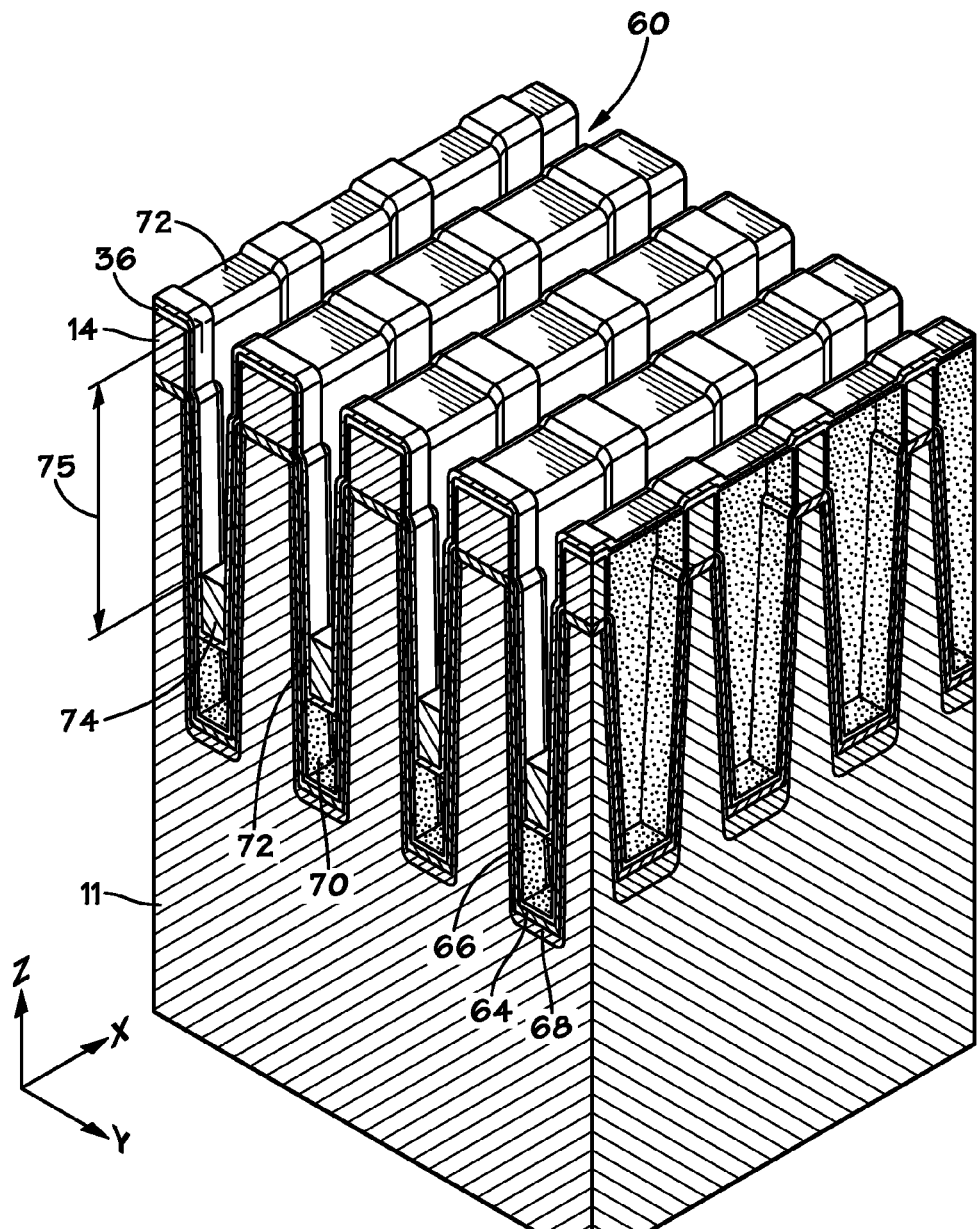

Continuing with FIG. 8, a spacer oxide 72 may be formed on the nitride 66 through any suitable process. A conductive material 74 may be conformally deposited on the spacer oxide 72 through any suitable process. The conductive material may be tungsten, titanium nitride, tungsten nitride, any suitable refractory metal, refractory metal compound, or combination thereof. Next, in FIG. 9, the conductive material 74 may be recessed to a desired depth 75 to expose the spacer oxide 72. The remaining conductive material 74 in the trenches 60 may form the digitlines in the bottom of the trenches 60.

Figure 10:
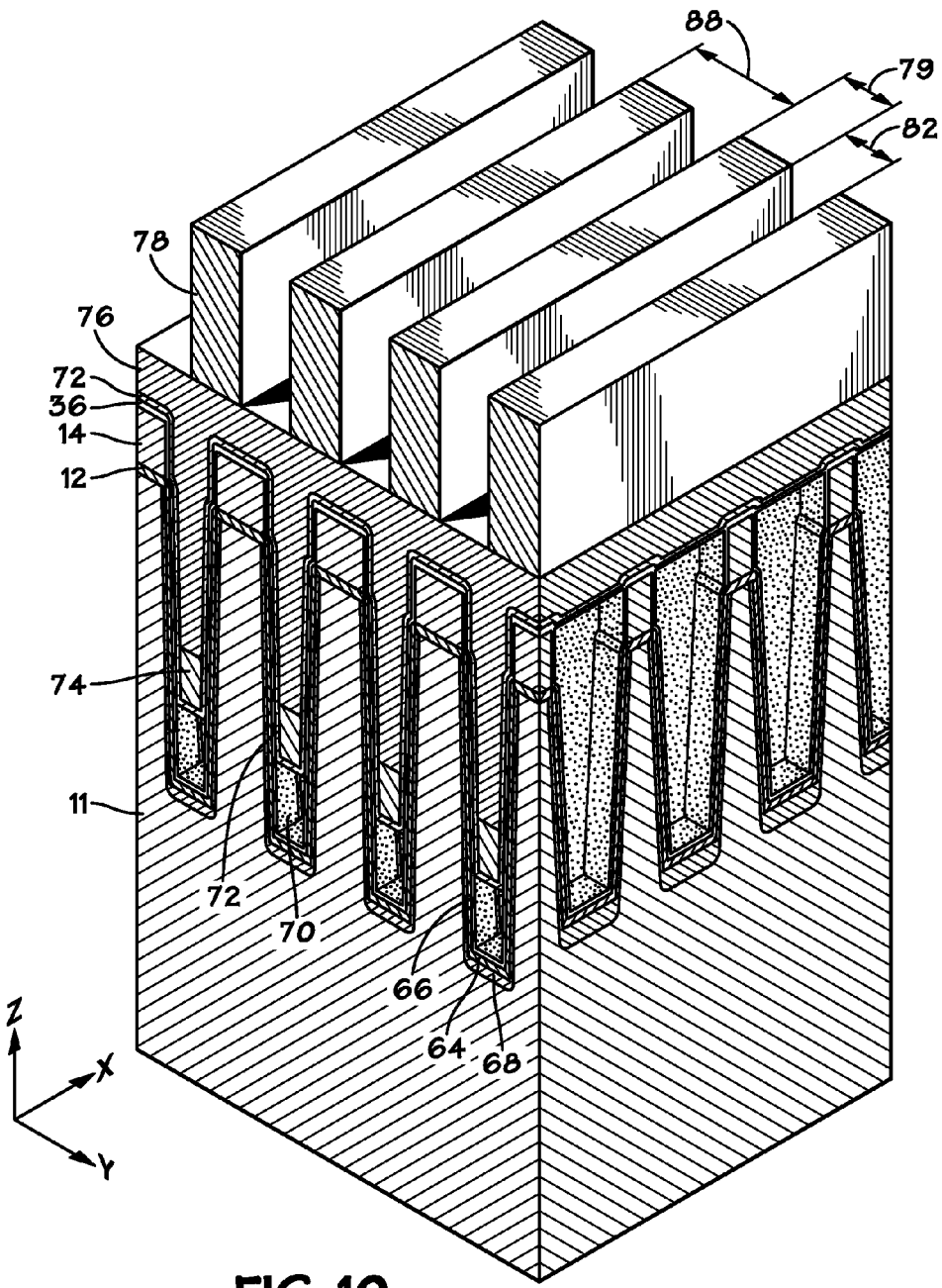

Turning now to FIG. 10, a single-sided opening may be patterned in the trenches 60 using photolithography or other suitable lithographic processes. In some embodiments, an anti-reflective coating (ARC), such as a BARC 76 may be conformally deposited on pillars 62 and trenches 60. A single-sided opening mask 78 may be formed on the ARC 76 to define masked regions having a width 79 and exposed regions having a width 82. The mask 78 may be formed with photoresist, a hard masking material, a carbon-based hard mask, and may be patterned with any photolithography or other lithographic processes, including spacer based patterning techniques. The mask 78 may define a repeating pattern of lines with a pitch 88. The masked regions of the mask 78 may be generally straight, generally parallel to one another, and may generally extend in the X-direction. Further, to pattern the desired single-sided opening in the trenches 60, the masked regions of the mask 78 may be slightly offset from the trenches 60.

Figure 11:
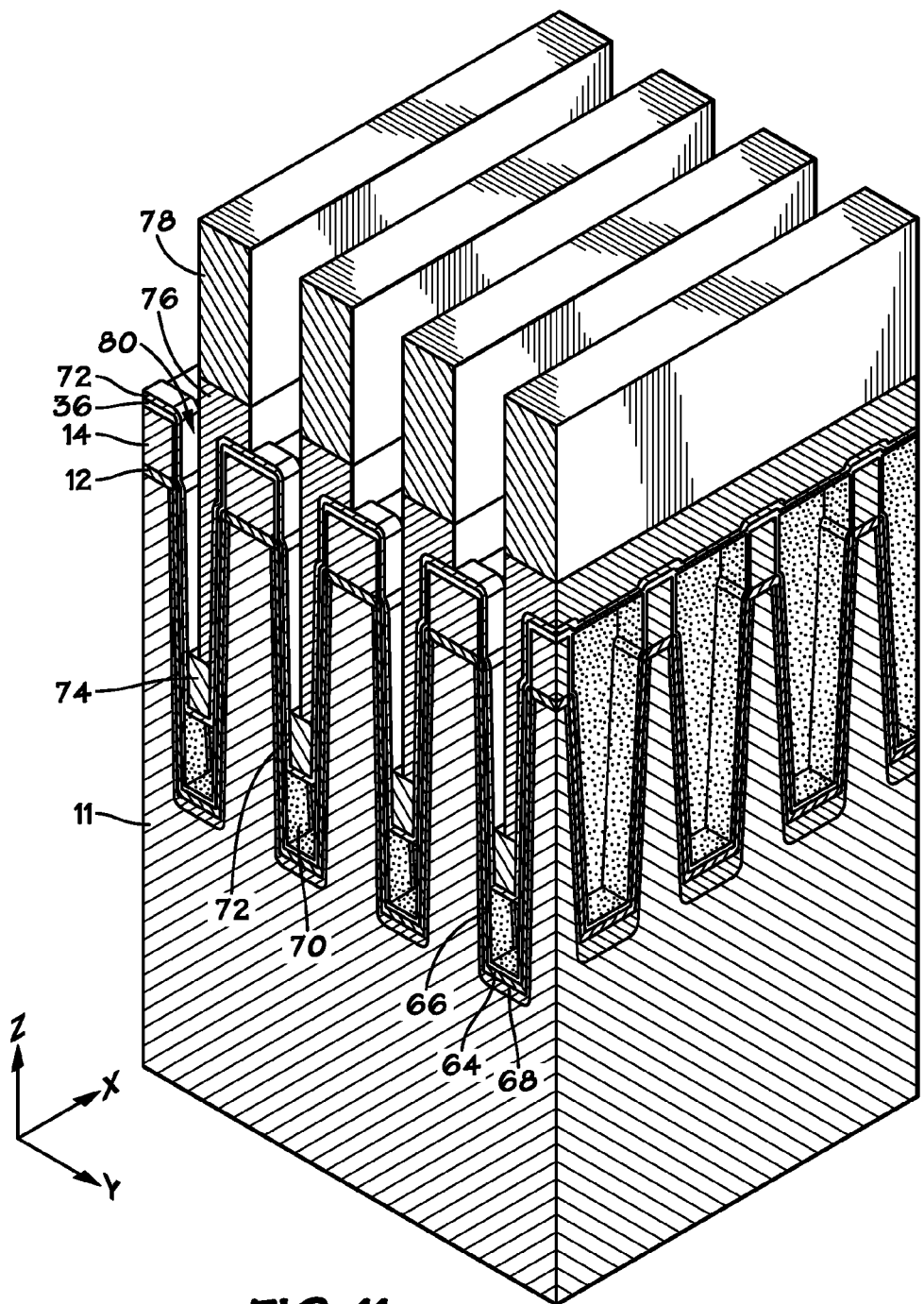

Next in FIG. 11, a single-sided opening 80 may be formed in the trench 60. The single-sided opening 80 may be formed with a dry etch or other suitable etch process that etches the BARC 76. As shown in FIG. 11, the conductive material 74 may be partially exposed at the bottom of the trench, e.g., on one side of the trench 60. The spacer oxide 72 may act as an insulating film between the digitline (e.g., conductive material 74) and active silicon and, as described below, may be resident on one side of the trench 60.

Figure 12:
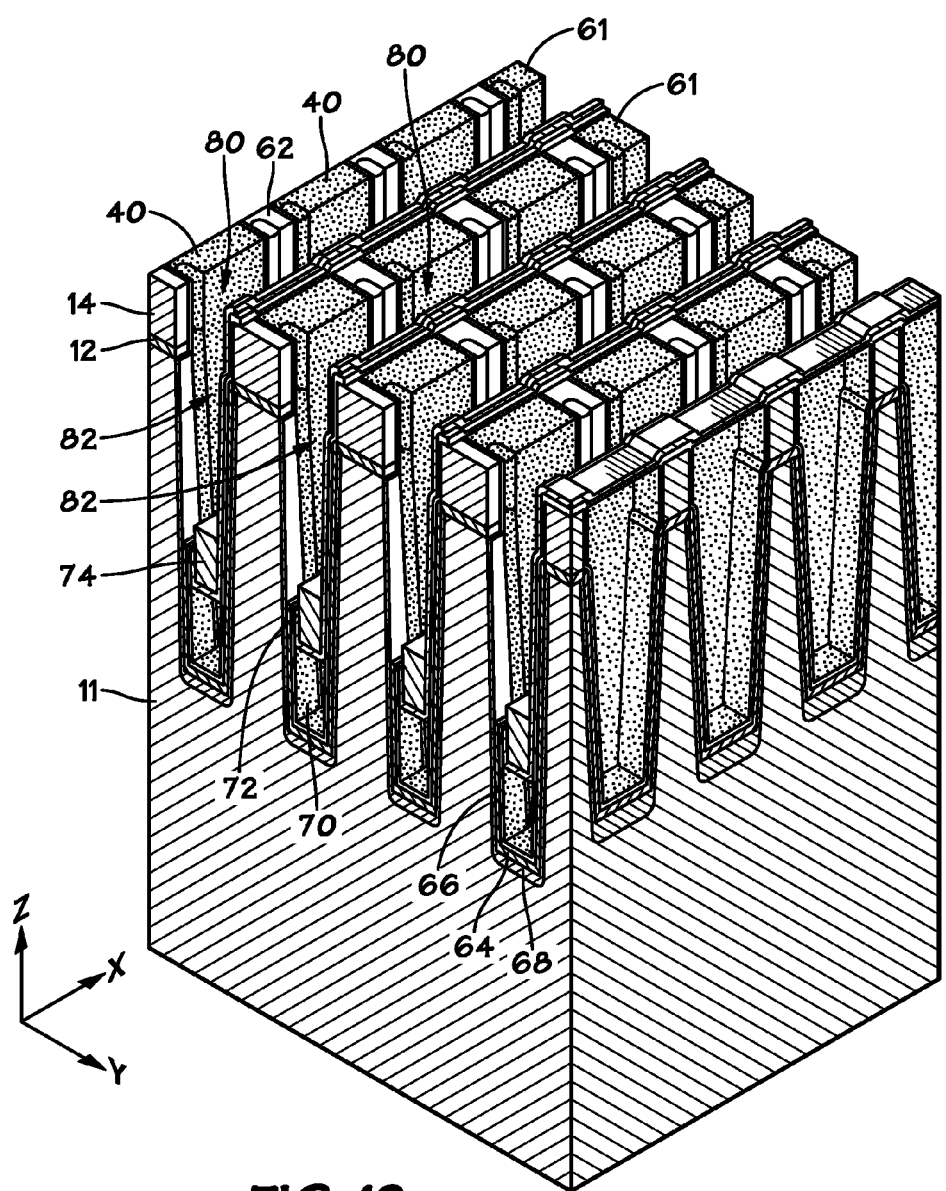

As shown in FIG. 12, various materials may be removed from the sidewalls 82 of the single-sided openings 80 of the trenches 60 to expose the silicon substrate on the sidewalls 82. Additionally, as noted above, the conductive material 74 remains exposed at the bottom of the single-sided opening 80 of the trench 60. The spacer oxide 72, the nitride 66, and the oxide 64 may be removed from the sidewalls 82 and the top portions of the fins 61 by wet etch or other suitable etch processes. Additionally, the remaining BARC 76 may be removed by wet etch or other suitable etch processes. After etching, excess material may be removed from the trenches 60 via a hydrofluoric acid clean or other process.

Figure 13:
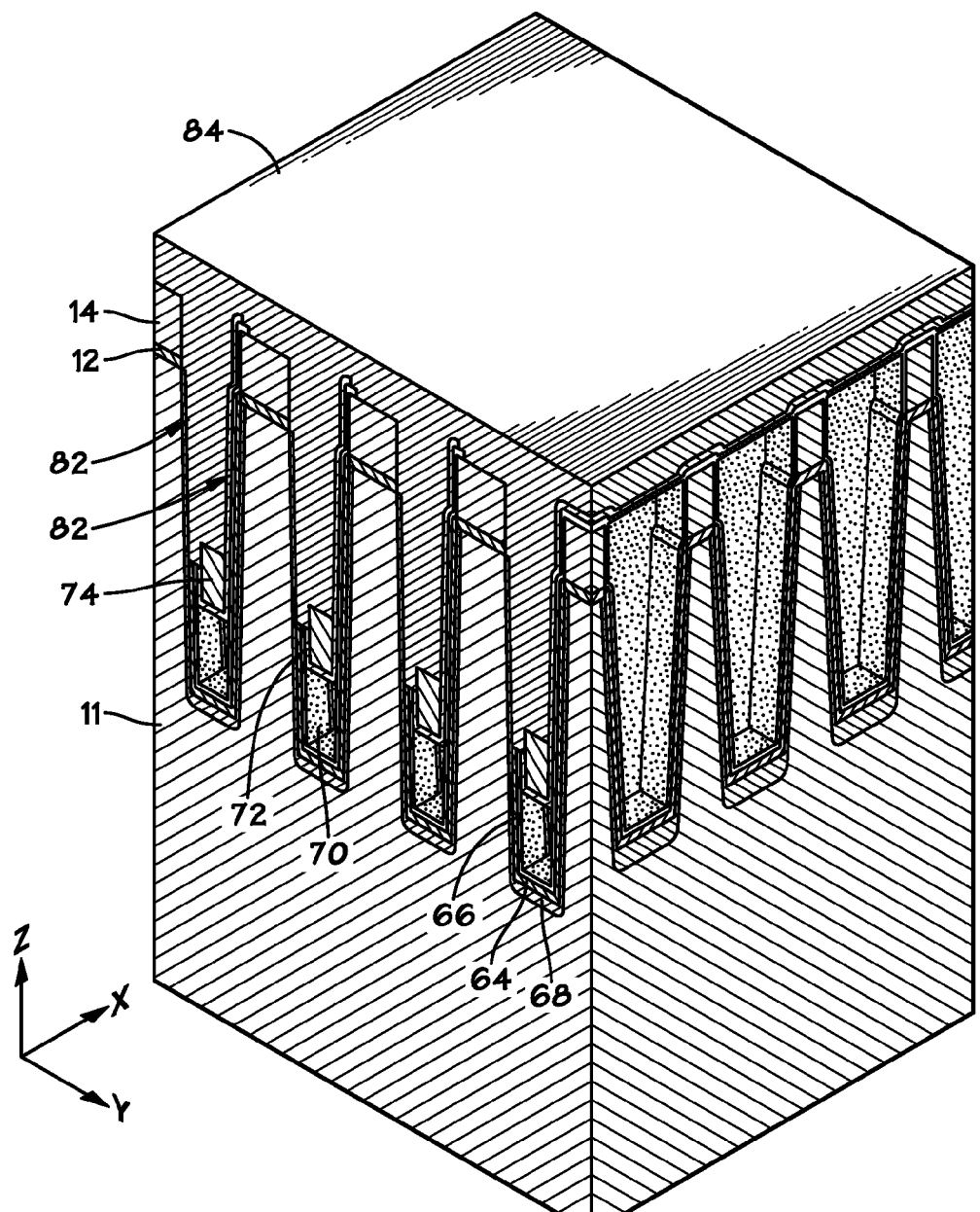

Next in FIG. 13, a doped polysilicon 84 (e.g., N+ type) may be conformally deposited on the pillars 62 and in the trenches 60. The doped polysilicon 84 may be deposited by any suitable process. The doped polysilicon 84 may forms a connection between the exposed digitlines and the exposed silicon on the sidewalls 82.

Figure 14:
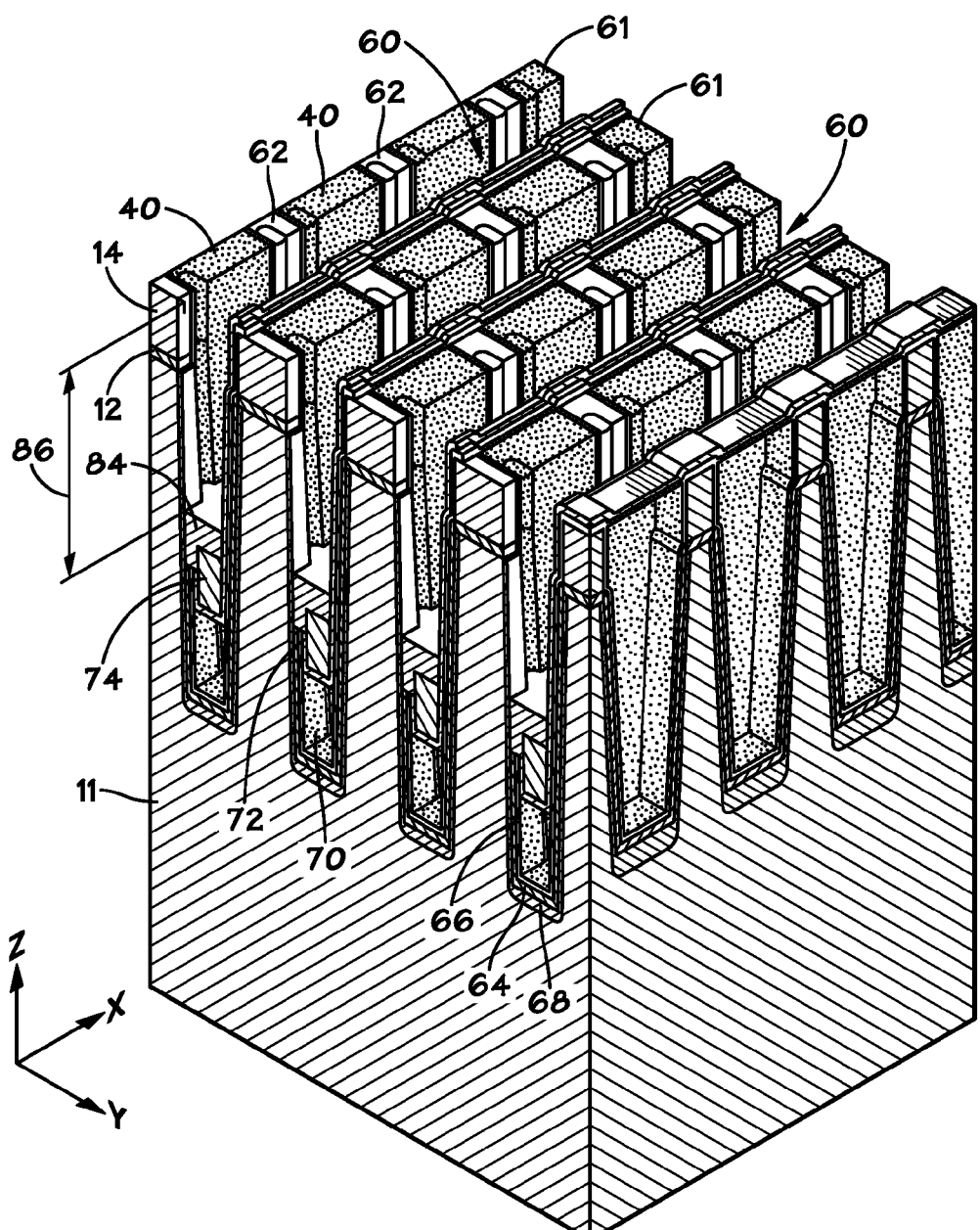

Next, in FIG. 14, the doped polysilicon 84 may be etched to a desired depth 86 by dry etch or other suitable etch processes. In one embodiment, the depth 86 may be about 1000 Å. The remaining doped polysilicon 84 in the trenches 60 may form a contact to the exposed silicon on the sidewalls 82 without doping the entire fin of the sidewall 82. The remaining doped polysilicon 84 may be referred to as a single-sided contact (also referred to as a "strap") between the digitlines 74 and the silicon sidewall 82.

Figure 15:
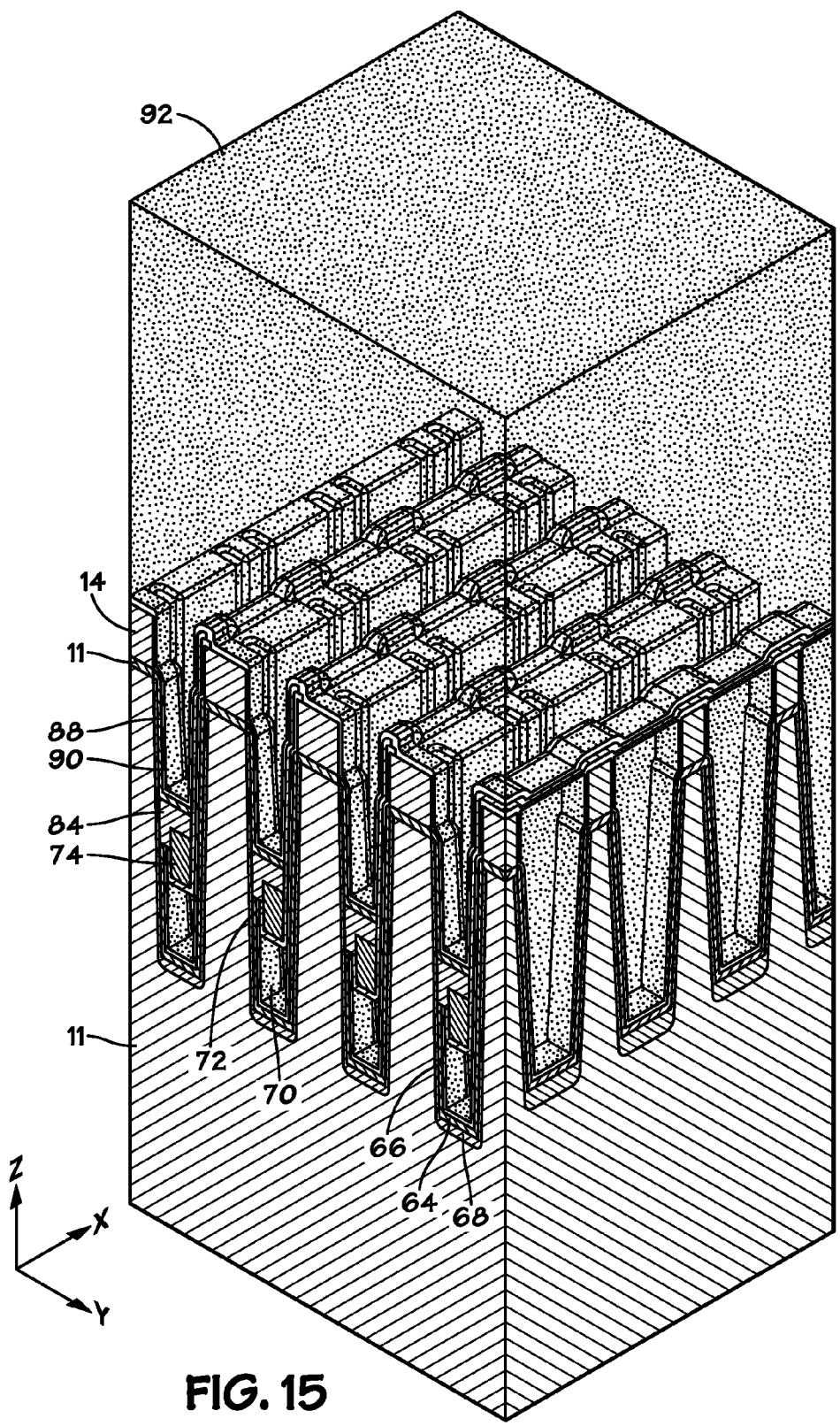

Next in FIG. 15, a second oxide 88 may be formed on the exposed silicon sidewall 82 and on the doped polysilicon 84 at the bottom of the trench 60. A second nitride 90 may be formed on the second oxide 88. Finally, an insulator 92 (e.g., a SOD) may be conformally deposited on the fins and in the trenches 60 and disposed on the second nitride 90. As can be seen in FIG. 15, the insulator 92 electrically insulates the digitlines 74 and the contact 84 to enable formation of a wordline above the digitlines.

Figure 16:
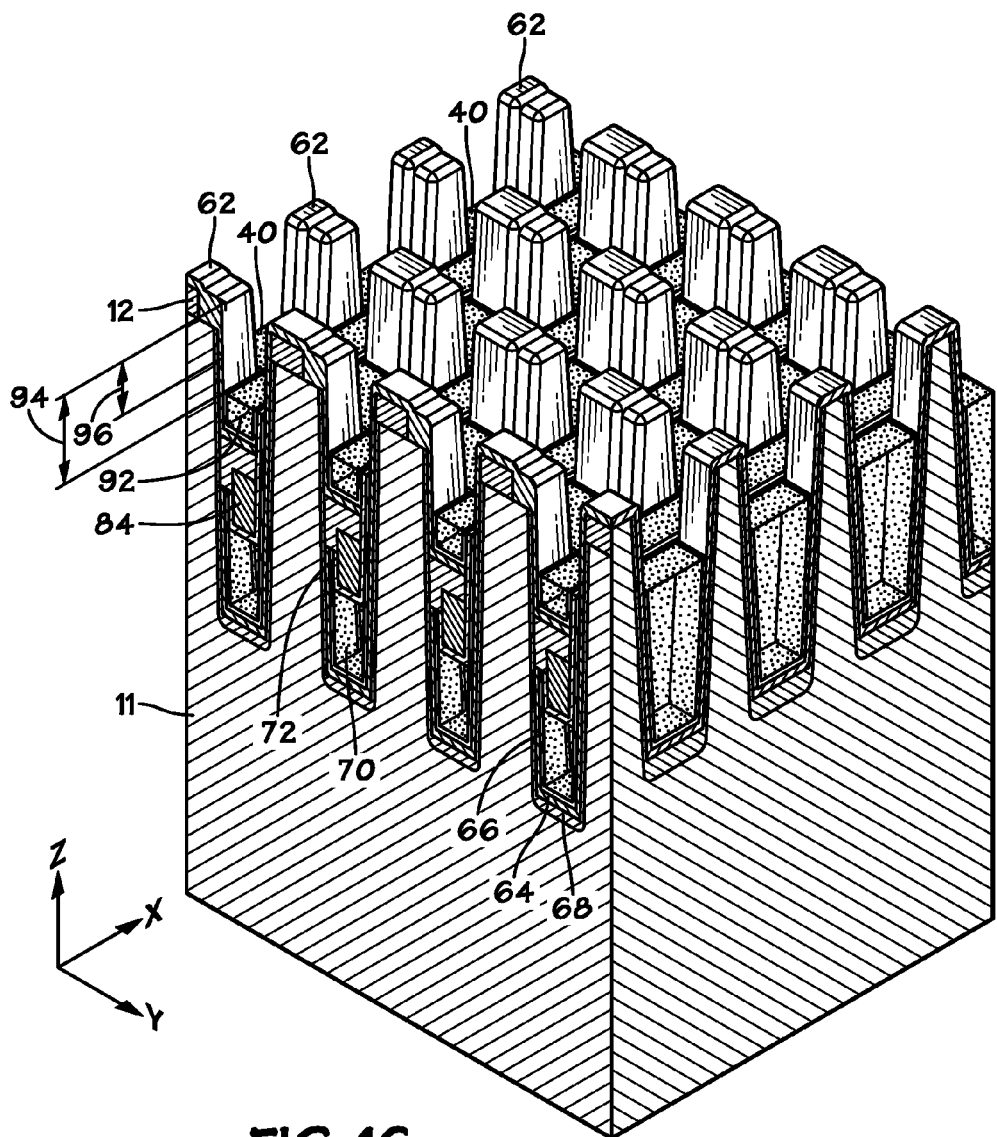

Continuing with FIG. 16, the insulator 40 and the insulator 92 may be removed by any suitable etch process. Thus, as shown in FIG. 16, the insulator 92 may be removed to a depth 94, exposing silicon pillars 62. Additionally, the insulator 50 may be removed from between the pillars 62 to a depth 96. Further, removal of the insulators 92 and/or 40 may result in diffusion of dopant from the contact 84 to the silicon sidewalls 82, as a result of any thermal component of the removal process. Finally, to completely expose the pillars 62, the second nitride 90 may be removed from the tops and sides of the pillars 62 via wet etch or other suitable etching process.

Figure 17:
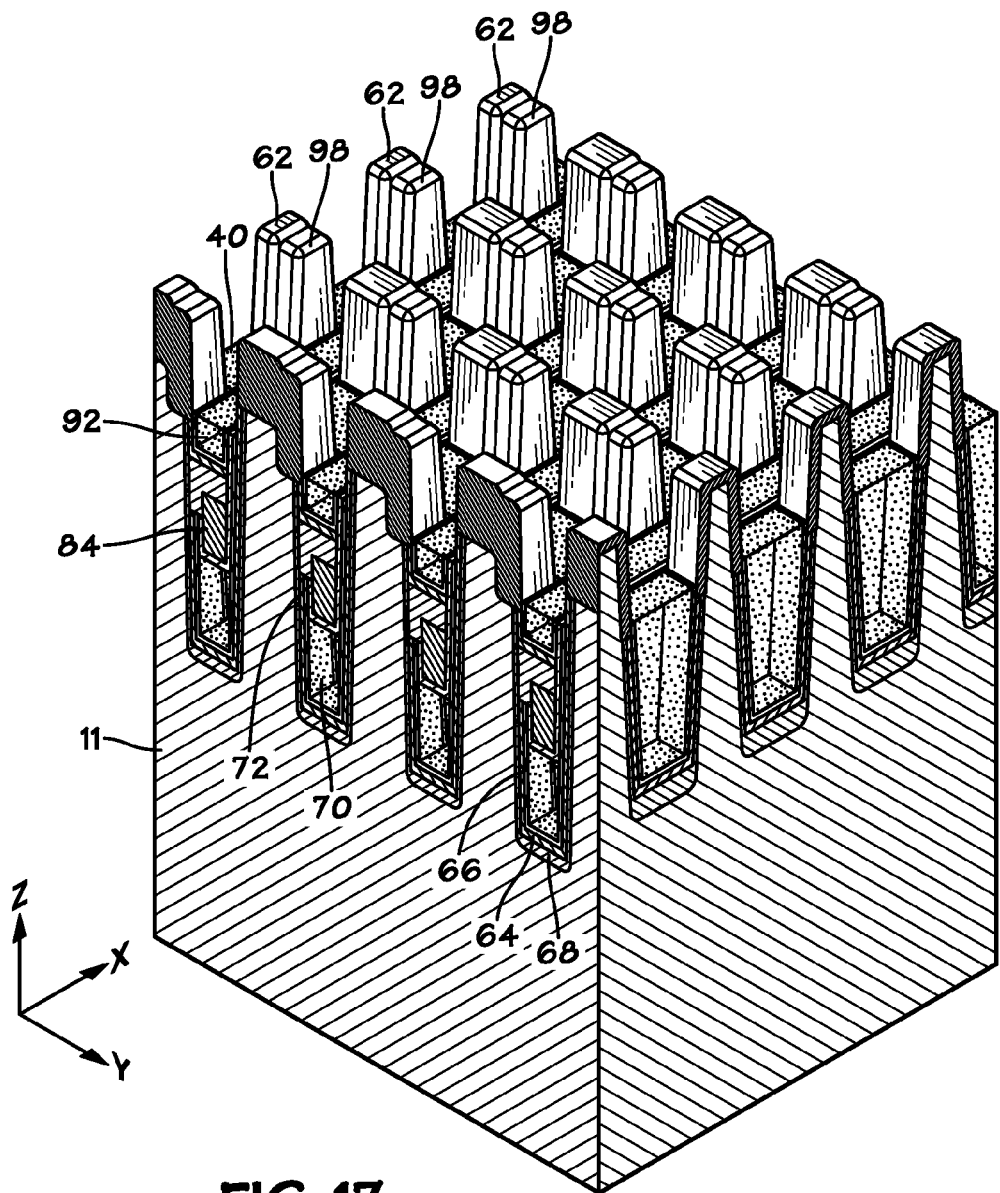

Next in FIG. 17, a gate oxide 98 may be formed on the pillars 62. Formation of the gate oxide 98 may include precleaning to remove excess materials and prepare the pillars 62 for formation of the oxide 98. In one embodiment, the gate oxide 98 may be formed by in situ steam generation (ISSG). This process may enable formation of the gate oxide to a uniform thickness. In other embodiments, any suitable process capable of formation of the gate oxide 98 to a uniform or substantially uniform thickness may be used to form the gate oxide 98.

Figure 18:
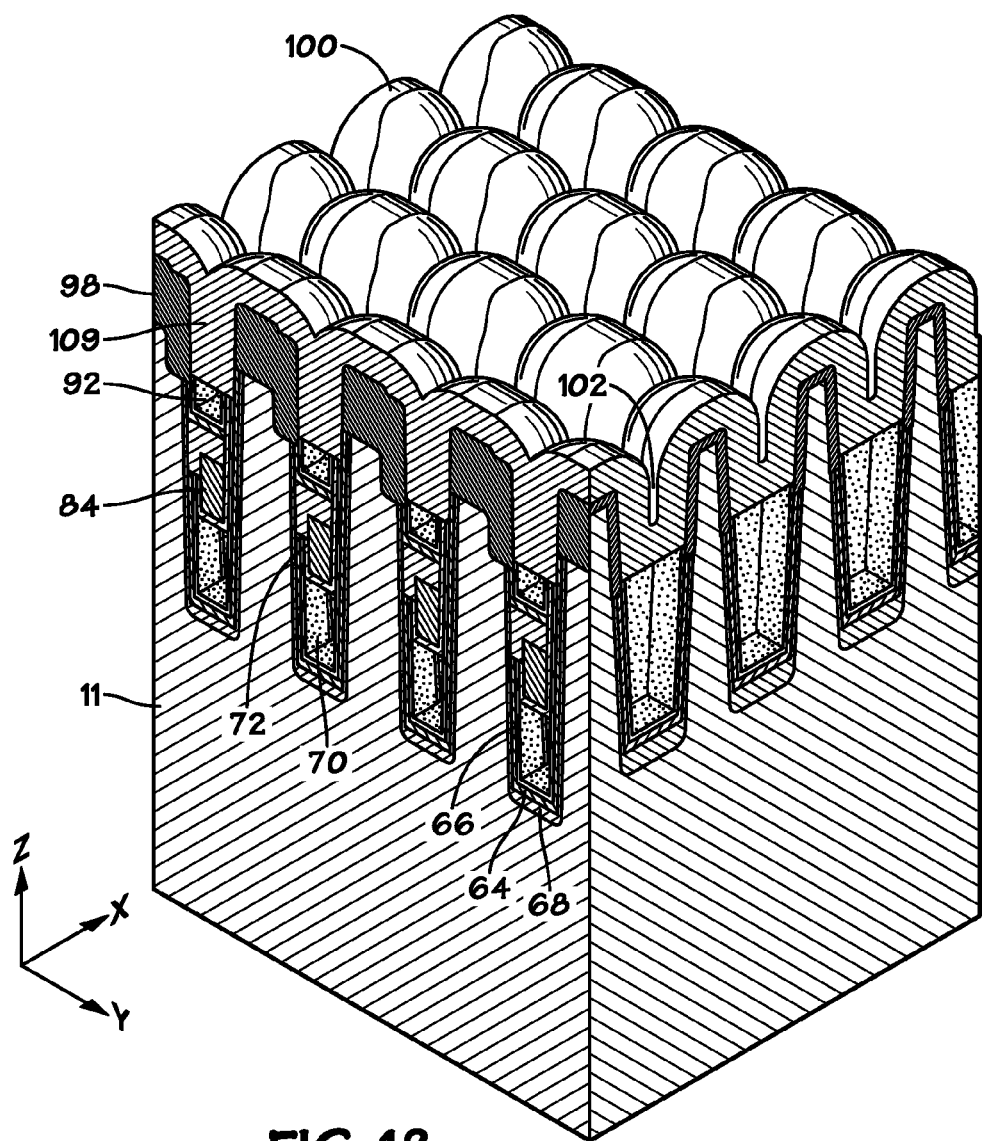

In FIG. 18, a gate electrode 100 may be conformally deposited on the surface of the device 10. The gate electrode 100 may include titanium nitride, tungsten nitride, tungsten, or any suitable conductor or combination thereof. As shown in FIG. 18, conformal deposition of the gate electrode 100 may form the gate electrode 100 having gapped regions 102 in the X-direction and pinched regions 104 in the Y-direction.

Figure 19:
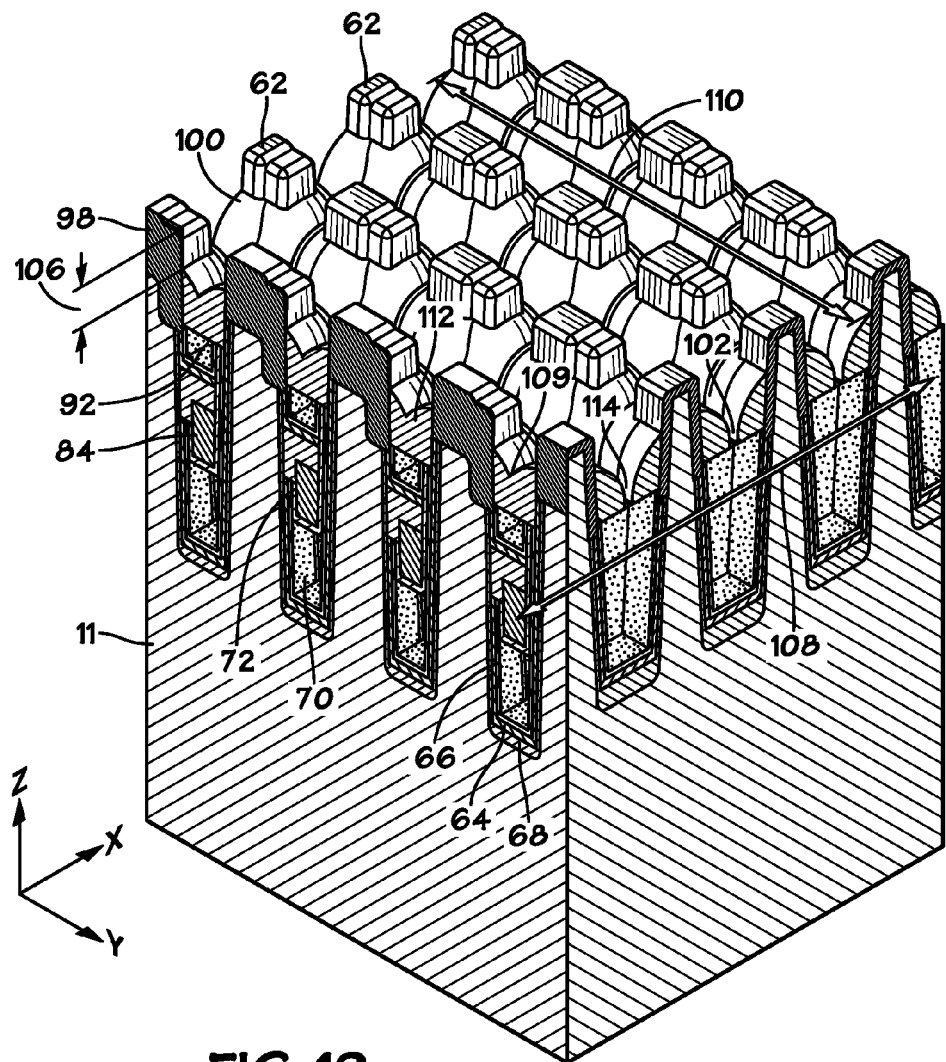

Next in FIG. 19, the gate electrode 100 may be etched by spacer etch or other suitable etching process. The gate electrode 100 may be etched to expose a height 106 of the pillars 62. As shown in FIG. 19, the digitlines extend in the X-direction in a first plane as shown by arrow 108 and the wordlines extend in the Y-direction in a second plane as shown by arrow 110. Additionally, removal of the gate electrode 100 may exploit the gapped regions 102 and the pinched regions 104 to from the continuous gate electrode in the wordline direction (e.g., the Y-direction) and a discontinuous gate electrode in the digitline direction (e.g., X-direction). For example, as seen in FIG. 19, in the Y-direction the gate electrode 100 includes continuous regions 112 wrapping around each pillar 62 in the Y-direction. In contrast, in the X-direction, the gate electrode 100 includes "gaps" 114 between each pillar 62 in the X-direction. The construction of the gate electrode 100 in this manner may enable better gate control of the transistors of the device 10.

Figure 20:
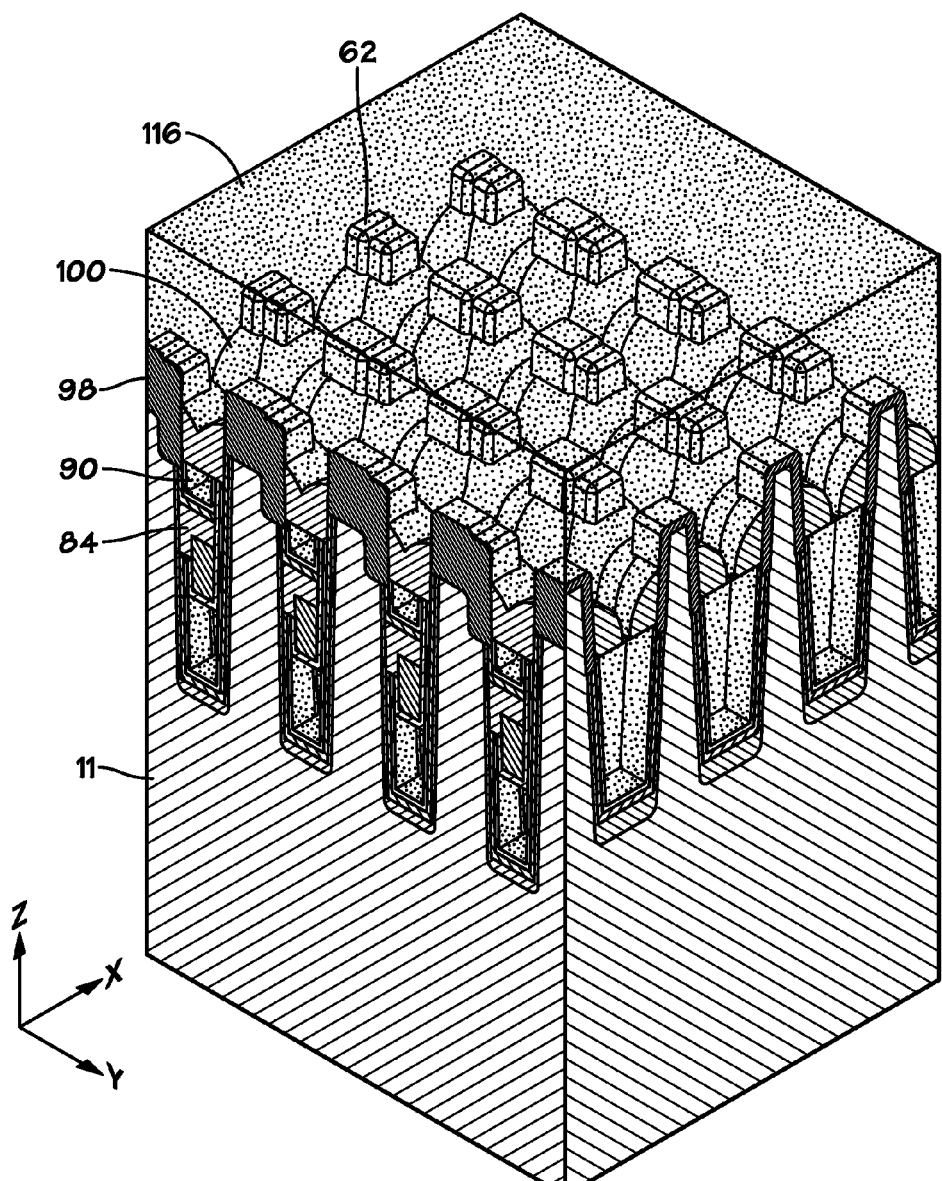

FIGS. 20-24 depict formation of a storage node contact disposed above the gate electrode 100. Initially, as shown in FIG. 20, a contact oxide 116 may be conformally deposited on the gate electrode 100 and exposed portions of the pillars 62. The deposited contact oxide 116 may be planarized via CMP or other planarization processes.

Figure 21:
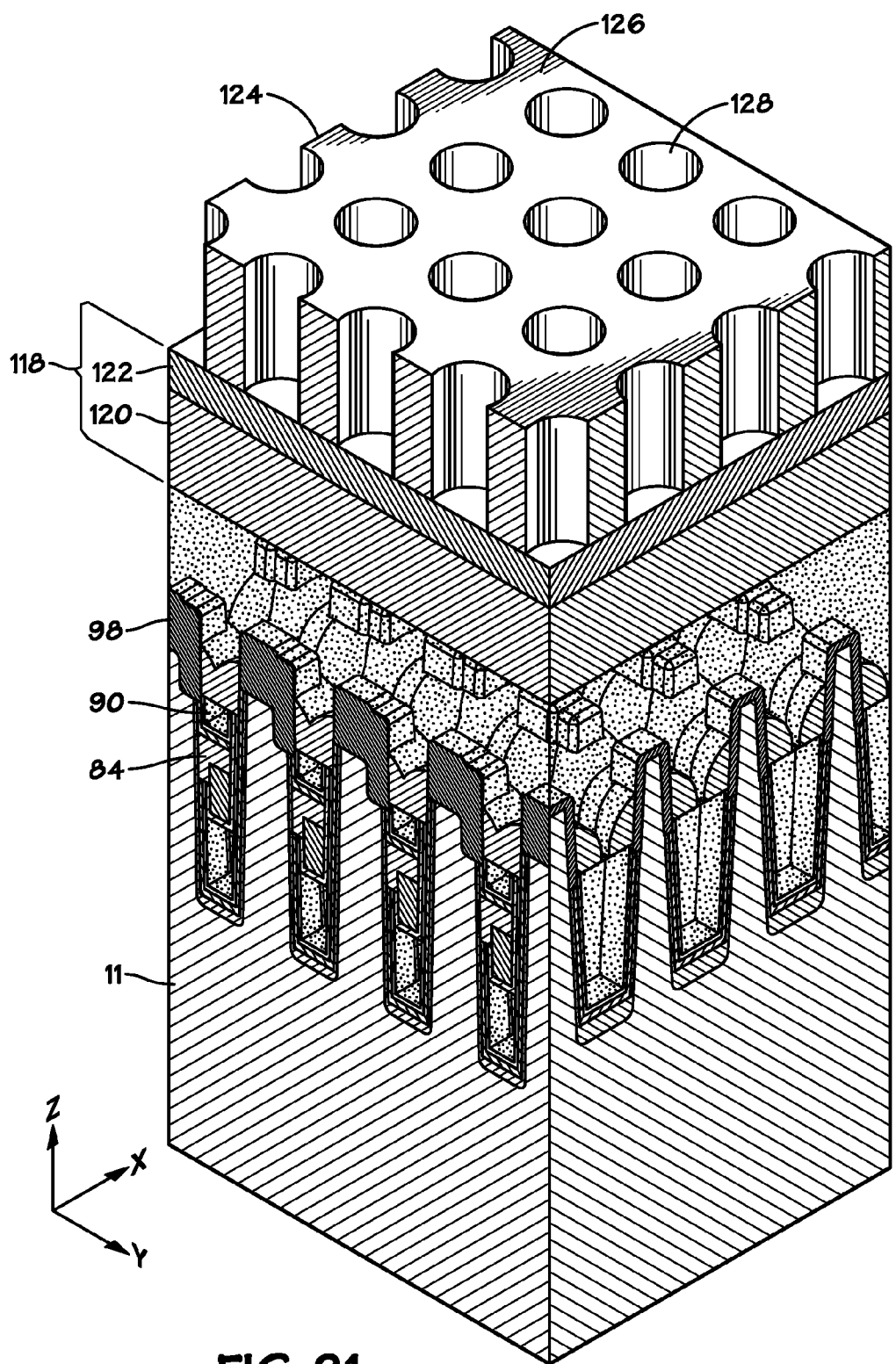

Next in FIG. 21, a contact Multi-Layer Reticles (MLR) 118 may be formed on the contact oxide 116. The MLR 118 may include an MLR underlayer 120 and an MLR hard mask 122. Next, a mask 124 may be formed on the MLR 118 to define masked regions 126 and exposed regions 128 in a grid pattern substantially aligned with the pillars 62. The mask 124 may be formed with photoresist, a hard masking material, a carbon-based hard mask, and may be patterned with any photolithography or other lithographic processes, including spacer based patterning techniques.

Figure 22:
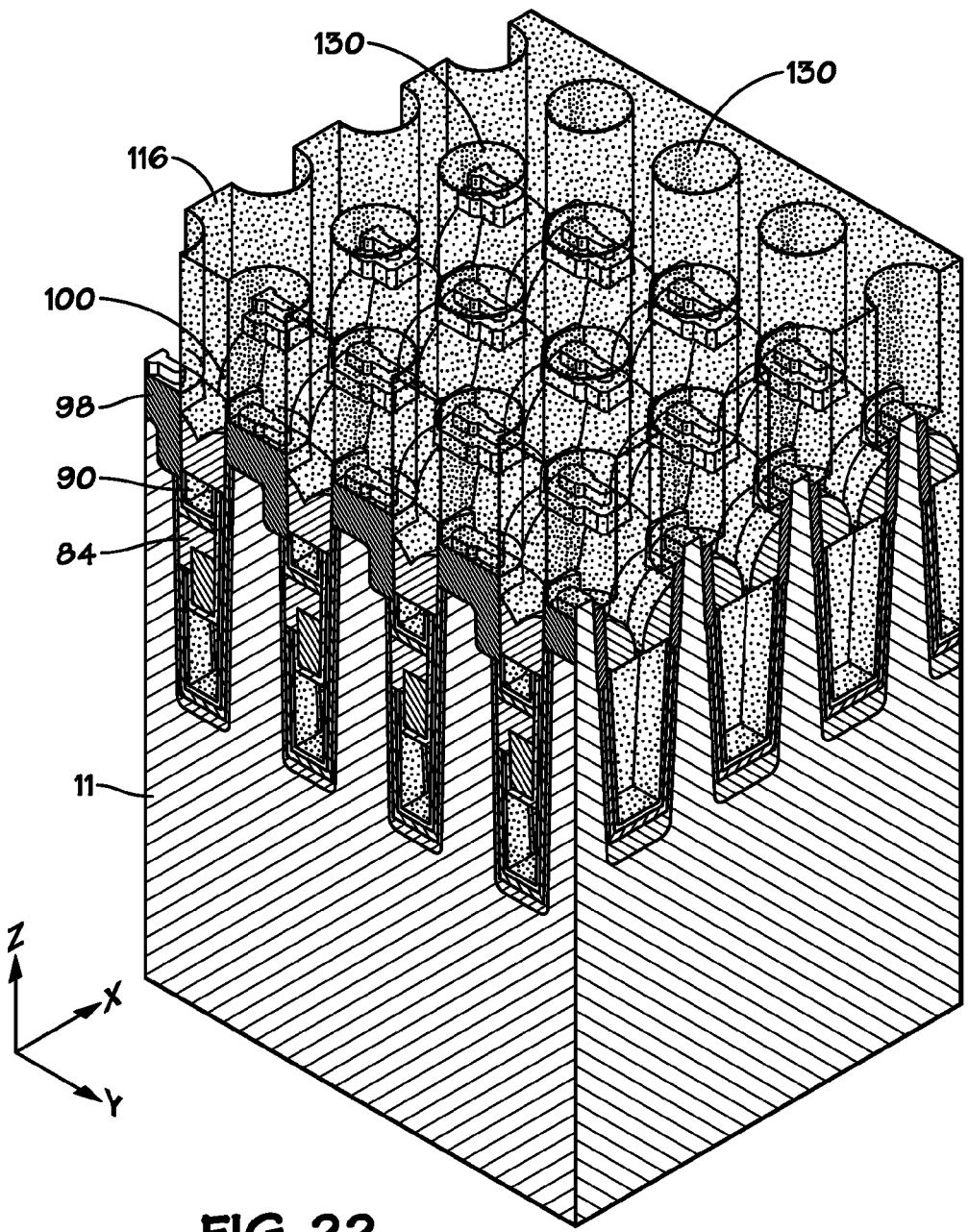

Next, as shown in FIG. 22, contact regions 130 may be formed in the contact oxide 116. The contact regions 130 may be formed with a dry etch or other suitable etch process that etches the MLR 118 and the contact oxide 116. As shown in FIG. 22, the contact regions 130 may be etched to the exposed portion of the pillars 62 and the surrounding gate electrode 100. In some embodiments, the top of the pillar 62 may be implanted with n+ type dopant or other dopants.

Figure 23:
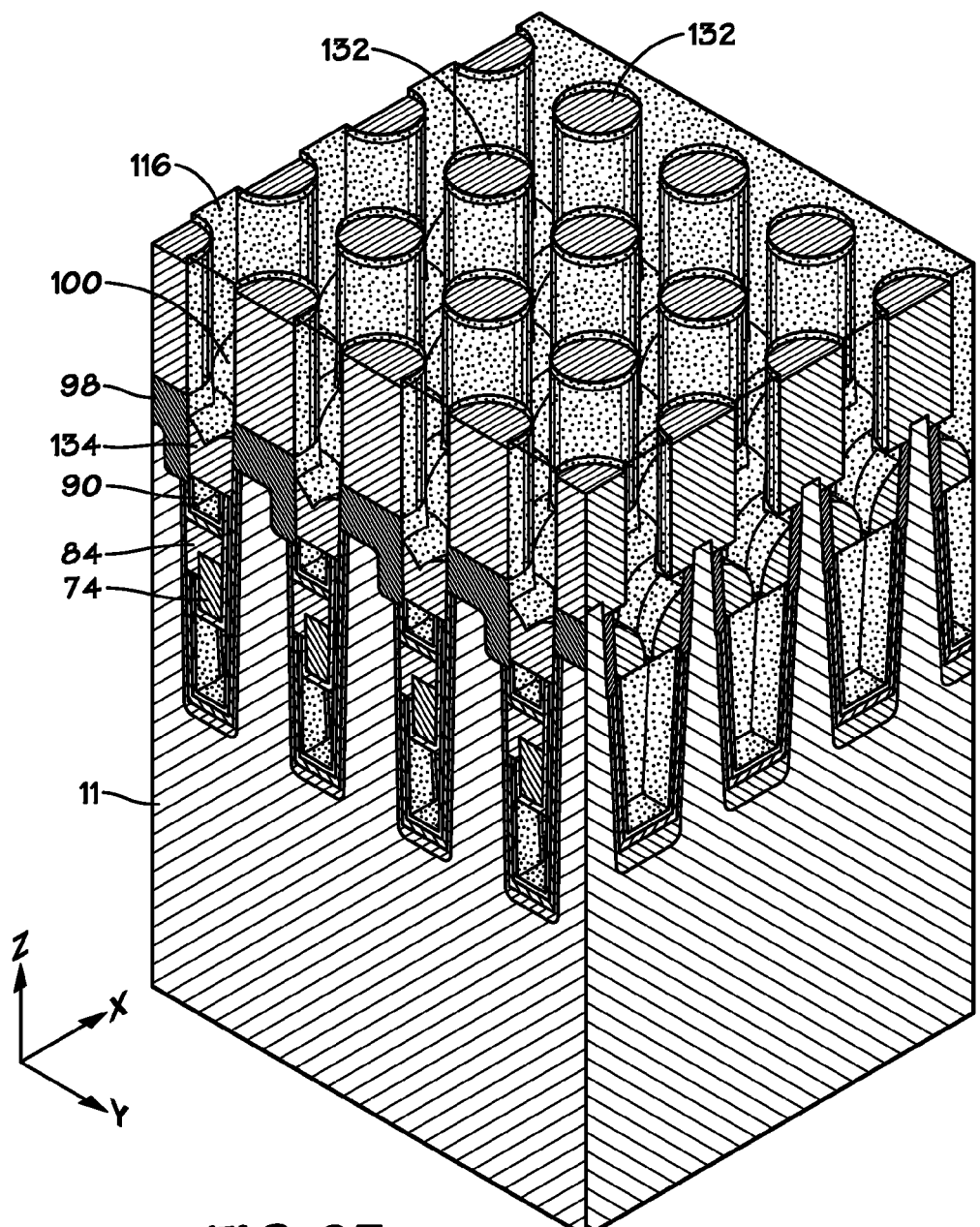

Turning now to FIG. 23, contacts 132 may be formed in the contact regions 130 by deposition of doped polysilicon 134 (e.g., N+ type polysilicon) in the contact regions 130. In other embodiments, the contacts may be formed by deposition of tungsten, tungsten nitride, titanium nitride, any other suitable metal or metal compound, or combination thereof. The contact 116 and the contacts 132 may be planarized via CMP or other suitable planarization processes.

Figure 24:
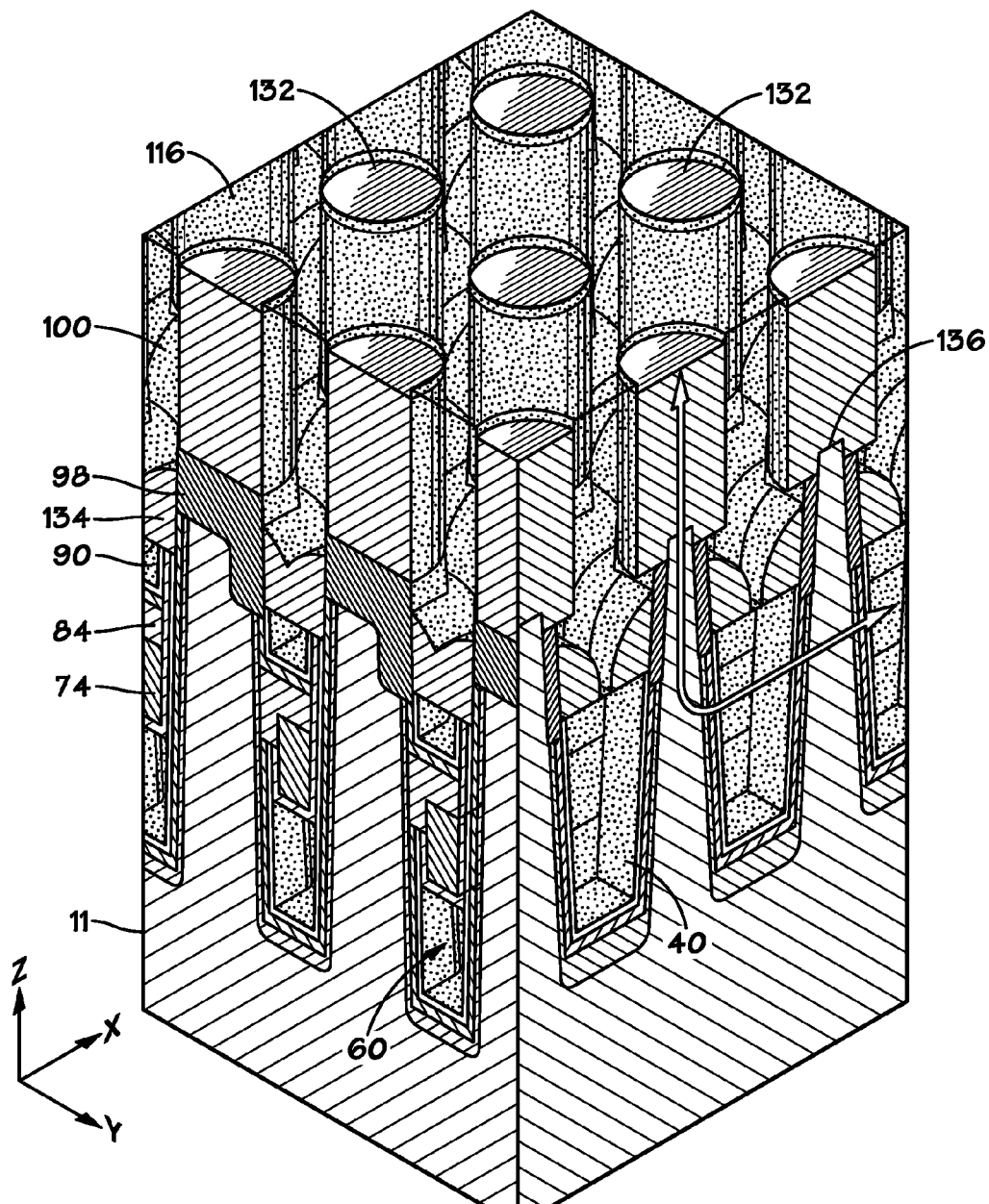

FIG. 24 depicts a close-up of the final structure after formation of buried digitlines, buried wordlines, and contacts 132. As shown in FIG. 24, the digitlines 74 and digitline contacts 84 are constructed below wordlines 134. Both the digitlines 74 and the wordlines 134 are subsurface to the contacts 132. The contacts 132 interface with cell contacts 136 at the upper portion of the pillars 62. The contacts 132 take advantage of the entire portion of the pillar 62. As discussed above, the gate oxide 100 may be recessed below the surface of the pillar 62 to provide a greater area for connection to the contact 132. Thus, the area of the contact 132 is increased by wrapping the contact 132 around the top region of each pillar 62. Further, the contracts 132 may be constructed substantially larger than structures with conventional digitlines, as the area used for such digitlines is now available for construction of the contacts 132.

In some embodiments, capacitive elements may be formed over each pillar 62 to provide greater vertical height each element and thus increase capacitance. In other embodiments, the doping may be adjusted to form floating body cells (FBC) and provide storage capacity in the structure 10.

What is claimed is:

1. A method, comprising:
    forming a first trench in a substrate;
    forming a second trench in the substrate perpendicular to and in a plane below the first trench;
    forming a data line in the second trench, wherein forming the data line in the second trench comprises forming a single-sided opening in the second trench;
    forming an access line in the first trench, wherein the access line is formed vertically above the data line;
    forming a contact vertically above the access line.

2. The method of claim 1, wherein the width of the second trench is less than the width of the first trench.

3. The method of claim 1, comprising forming a data line contact in the single-sided opening of the second trench, wherein the data line contact electrically connects the substrate to the data line.

4. The method of claim 3, wherein the data line and the access line are vertically separated by an insulator disposed on the data line contact.

5. The method of claim 1, wherein forming the access line comprises forming a gate electrode.

6. The method of claim 5, wherein the gate electrode is continuous in the direction of the first trench and discontinuous in the direction of the second trench.

7. The method of claim 5, comprising removing the gate electrode to expose a pillar of the substrate.

8. The method of claim 7, comprising patterning a contact region around the pillar and disposing a contact material in the contact region around the pillar to form the contact.

9. The method of claim 1, wherein the access line comprises a wordline and the data line comprises a digitline.

10. A method of manufacturing a memory device, comprising:
- forming a plurality of buried access line trenches in a substrate;
- forming a plurality of buried data line trenches in the substrate perpendicular to the plurality of buried access line trenches, wherein the intersection of the plurality of buried access line trenches and the plurality of buried data line trenches define a plurality of pillars extending from the substrate;
- forming a plurality of data lines in the plurality of buried data line trenches, wherein the plurality of data lines are formed before formation of any transistors of the memory device;
- forming a plurality of structures in electrical contact with a top portion of the plurality of pillars; and
- forming a gate electrode on the plurality of access line trenches and the plurality of data line trenches.

11. The method of claim 10, comprising forming a plurality of access lines in the plurality of buried access line trenches after forming the plurality of data lines.

12. The method of claim 11, wherein the plurality of access lines comprise a plurality of word lines and the plurality of data lines comprise a plurality of digitlines.

13. The method of claim 10, wherein forming the plurality of structures comprises forming a plurality of contacts.

14. The method of claim 10, wherein forming the plurality of data lines comprises depositing a conductive material in the plurality of data line trenches and removing a portion of the conductive material to a first depth in the plurality of data line trenches.

15. The method of claim 10, comprising forming a plurality of data line contacts in the plurality of data line trenches.

16. The method of claim 15, wherein forming the plurality of data line contacts comprises:
- forming a single-sided opening in each of the plurality of data line trenches;
- exposing a portion of the substrate on a sidewall of each of the plurality of data line trenches; and
- depositing a polysilicon material between each of the plurality of data lines and the exposed portion of the substrate.

17. The method of claim 10, comprising removing a portion of the gate electrode to expose a top portion of each of the plurality of pillars.

18. The method of claim 17, wherein removing a portion of the gate electrode comprises forming a discontinuous gap in the gate electrode between each pillar in the direction of the plurality of data line trenches.

19. A memory device, comprising:
- a plurality of vertical cell contacts electrically coupled to a silicon substrate;
- a plurality of access lines formed in a first direction in a first plane below the vertical cell contacts in the silicon substrate;
- a plurality of data lines formed in a second direction in a second plane below the plurality of access lines in the silicon substrate, wherein the first direction is perpendicular to the second direction; and
- a plurality of data line contacts disposed between and electrically coupled to the data lines and the silicon substrate, wherein the data line contacts contact the data lines on multiple sides of the data line and connect to pillared portions of the silicon substrate.

20. The memory device of claim 19, comprising a plurality of silicon pillars extending vertically from the substrate and defined by an intersection of a first plurality of trenches in the first direction and a second plurality of trenches in the second direction, wherein the plurality of vertical cell contacts are coupled to the silicon pillars.

21. The memory device of claim 20, comprising a plurality of data line contacts disposed between the plurality of data lines and a sidewall of the second plurality of trenches.

22. The memory device of claim 20, comprising a gate oxide disposed around each of the plurality of pillars, wherein the gate oxide is continuous in the first direction and discontinuous in the second direction.

23. The memory device of claim 19, wherein the plurality of access lines comprise a plurality of word lines and the plurality of data lines comprise a plurality of digitlines.

* * * * *